(12) United States Patent
Warne et al.

(10) Patent No.: US 9,374,887 B1
(45) Date of Patent: Jun. 21, 2016

(54) SINGLE-RESONATOR DOUBLE-NEGATIVE METAMATERIAL

(75) Inventors: Larry K. Warne, Albuquerque, NM (US); Lorena I. Basilio, Albuquerque, NM (US); William L. Langston, Albuquerque, NM (US); William A. Johnson, Albuquerque, NM (US); Jon Ihlefeld, Albuquerque, NM (US); James C. Ginn, III, Oviedo, FL (US); Paul G. Clem, Albuquerque, NM (US); Michael B. Sinclair, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 566 days.

(21) Appl. No.: 13/618,997

(22) Filed: Sep. 14, 2012

Related U.S. Application Data

(60) Provisional application No. 61/536,937, filed on Sep. 20, 2011, provisional application No. 61/622,870, filed on Apr. 11, 2012.

(51) Int. Cl.
*H05K 1/02* (2006.01)
*H01P 1/20* (2006.01)
*H01P 7/10* (2006.01)

(52) U.S. Cl.
CPC ........ *H05K 1/024* (2013.01); *H01P 7/10* (2013.01); *H01P 1/2005* (2013.01)

(58) Field of Classification Search
CPC .................................. H01P 1/2005; H01P 7/10
USPC .................. 333/204, 205, 219, 235, 219.1, 2
See application file for complete search history.

(56) References Cited

U.S. PATENT DOCUMENTS

| | | | | | |
|---|---|---|---|---|---|
| 4,331,758 | A | * | 5/1982 | Luo | H01L 27/1214 204/192.32 |
| 6,160,463 | A | * | 12/2000 | Arakawa et al. | 333/202 |
| 2001/0052833 | A1 | * | 12/2001 | Enokihara et al. | 333/202 |
| 2005/0237135 | A1 | * | 10/2005 | Pance et al. | 333/219.1 |
| 2009/0040131 | A1 | * | 2/2009 | Mosallaei | 343/911 R |
| 2010/0086272 | A1 | * | 4/2010 | Li | B82Y 20/00 385/129 |

OTHER PUBLICATIONS

Nishikawa; "Microwave Ceramic Dielectrics and Their Applications"; Sep. 12-15, 1988; IEEE, p. 70.*
Smith, D.R. et al., "Homogenization of matematerials by field averaging (invited paper)", Journal of Optical Society of America, 2006, pp. 391-403, vol. 23, No. 3.
Kim, J. et al., "Simulation of metamaterial containing cubic high dielectric resonators", Physical Review B, 2007, pp. 115126-1-115126-6, vol. 76.

(Continued)

*Primary Examiner* — Robert Pascal
*Assistant Examiner* — Gerald Stevens
(74) *Attorney, Agent, or Firm* — Kevin W. Bieg

(57) ABSTRACT

Resonances can be tuned in dielectric resonators in order to construct single-resonator, negative-index metamaterials. For example, high-contrast inclusions in the form of metallic dipoles can be used to shift the first electric resonance down (in frequency) to the first magnetic resonance, or alternatively, air splits can be used to shift the first magnetic resonance up (in frequency) near the first electric resonance. Degenerate dielectric designs become especially useful in infrared- or visible-frequency applications where the resonator sizes associated with the lack of high-permittivity materials can become of sufficient size to enable propagation of higher-order lattice modes in the resulting medium.

11 Claims, 24 Drawing Sheets

(56) References Cited

OTHER PUBLICATIONS

Popa, B. et al., "Compact Dielectric Particles as a Building Block for Low-Loss Magnetic Matematerials", Physical Review Letters, 2008, pp. 207401-1-207401-4, vol. 100.

Kuester, E. F. et al., "A Negative Refractive Index Metamaterial Based on a Cubic Array of Layered Nonmagnetic Spherical Particles", Progress in Electromagnetics Research B, 2011, pp. 175-202, vol. 33.

Basilio, L. I. et al., "A negative-index metamaterial design based on metal-core, dielectric shell resonators", IEEE APS Symposium, Spokane, WA, 2011.

Ahmadi, A. et al., "Physical configuration and performance modeling of all-dielectric metamaterials", Physical Review B, 2008, pp. 045104-1-045104-11, vol. 77.

Jylha, L. et al., "Modeling of isotropic backward-wave materials composed of resonant spheres", Journal of Applied Physics, vol. 99, 2006, pp. 043102-1-043102-7.

Basilio, L. I. et al., "A Quick and Easy Simulation Procedure to Aid in Metamaterial Unit-Cell Design", IEEE Antennas and Wireless Propagation Letters, 2011, pp. 1567-1570, vol. 10.

Basilio, L. I. et al., "Microwave-Frequency, Negative-Index Metamaterial Designs Based on Degenerate Dielectric Resonators", IEEE Antennas and Wireless Propagation Letters, 2012, pp. 113-116, vol. 11.

Warne L. K. et al., "Perturbation Theory in the Design of Degenerate Spherical Dielectric Resonators", IEEE Transactions on Antennas and Propagation, 2013, pp. 2130-2141, vol. 61, No. 4.

Warne, L. K. et al., "Perturbation Theory in the Design of Degenerate Rectangular Dielectric Resonators", Progress in Electromagnetics Research B, 2012, pp. 1-29, vol. 44.

Lin, X. Q. et al., "Controlling electromagnetic waves using tunable gradient dielectric metamaterial lens", Applied Physics Letters 92, 2008, pp. 131904-1-131904-3.

Antar, Y. M. M. et al., "Composite and Hybrid Dielectric Resonator Antennas: Recent Advances and Challenges", The 23rd National Radio Science Conference (NRSC 2006), Mar. 14-16, 2006, Menoufiya University, Egypt, pp. 1-7.

Poplavko, Y. M. et al., "Frequency-Tunable Microwave Dielectric Resonator", IEEE Transactions on Microwave Theory and Techniques, 2001, pp. 1020-1026, vol. 49, No. 6.

Derneryd, A. et al., "Dual-Polarized Dielectric Resonator Antennas for Base Station Applications", Proceedings of the 5th European Conference on Antennas and Propagation (ELICAP), Rome, Italy, 2011, pp. 606-610.

Ghadarghadr, S. and Mosallaei, H., "Coupled Dielectric Nanoparticles Manipulating Metamaterials Optical Characteristics", IEEE Transations on Nanotechnology, vol. 8, No. 5 (2009), pp. 582-594.

Basilio, L.I. et al., "An Infrared Negative-Index Layer Based on Single-Species Particles in a Polaritonic Host", Microwave Optical Technology Letters, vol. 53 (2011), pp. 1736-1740.

* cited by examiner

Dielectric sphere

Dielectric cube

Inclusions Selectively Shift Resonances by Making the Resonator Materials Artificially Anisotropic

$E_{inc}$ ⊙

SINGLE-RESONATOR DOUBLE-NEGATIVE METAMATERIAL

CROSS-REFERENCE TO RELATED APPLICATIONS

This application claims the benefit of U.S. Provisional Application No. 61/536,937, filed Sep. 20, 2011, and U.S. Provisional Application No. 61/622,870, filed Apr. 11, 2012, both of which are incorporated herein by reference.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to dielectric metamaterials and, in particular, to single-resonator double-negative metamaterials.

BACKGROUND OF THE INVENTION

Metamaterials based on resonant-cell structures are often used to obtain a negative index of refraction, where both the effective permittivity and permeability are negative, and operation is adjusted to occur just above spectrally overlapping magnetic and electric resonances of the cell structures. See S. Tretyakov, *Analytical Modeling in Applied Electromagnetics*, Artech House (2003). Other applications of metamaterials, including cloaking, require independent tuning of the permittivity and permeability and thus require the ability to place the resonances at the desired spectral positions. In addition to the selective placement of resonances, remaining in the effective material limit (with diffraction suppressed) is another goal in these types of metamaterial applications. See D. R. Smith and J. B. Pendry, *J. Opt. Soc. Am. B* 23(3), (2006); J. M. Lerat et al., *J. Appl. Phys.* 100, 084908 (2006); R. Liu et al., *Phys. Rev. E* 76, 026606 (2007); Th. Koschny et al., *Phys. Rev. B* 71, 245105 (2005); and P. A. Belov and C. R. Simovski, *Phys. Rev. E* 72, 026615 (2005). Often times unit cells containing metallic split-ring resonators (yielding the magnetically-resonant component) and loaded dipoles (yielding the electrically-resonant component) are used in constructing negative-index metamaterials since they can be small and still attain both negative permittivity and permeability. See J. B. Pendry et al., *IEEE Trans. Microwave Theory Tech.* 47(11), (1999); S. Tretyakov et al., *IEEE Trans. Antennas Propag.* 51, 2562 (2003); S. Tretyakov, *Microwave and Optical Technology Letters* 31(3), 163 (2001); J. Kim and A. Gopinath, *Phys. Rev. B* 76, 115126 (2007); B. Popa and S. Cummer, *Phys. Rev. Lett.* 100, 207401 (2008); M. Sinclair et al., *SPIE Optics+Photonics* (2011); and L. I. Basilio et al., *IEEE Antennas Wireless Propag. Lett.* 10, 1567 (2011). In these cases, tuning of the electric and magnetic resonances is achieved through the design of the respective resonators.

In recent years, all-dielectric resonant structures utilizing high-permittivity materials have drawn much attention since their use eliminates the material absorption inherent to metallic structures (which can become prohibitive at higher frequencies). While dielectric cylinders and rectangles have frequently been used to realize a medium of negative-permeability, all-dielectric resonators are not a natural fit for negative-index applications, since the first magnetic resonance occurs at a lower frequency than the first electric resonance. See J. Kim and A. Gopinath, *Phys. Rev. B* 76, 115126 (2007); B. Popa and S. Cummer, *Phys. Rev. Lett.* 100, 207401 (2008); and M. Sinclair et al., *SPIE Optics+Photonics* (2011).

Well-known approaches that have been used to attempt to align the resonances of all-dielectric resonators include the core-shell designs of Kuester and Basilio and the AB-type designs of Ahmadi and Jylha. See E. Kuester et al., *Prog. Electromag. Res. B* 33, 175 (2011); L. Basilio et al., *IEEE APS-Symp.*, Spokane, Wa., USA (2011); A. Ahmadi and H. Mosallaei, *Phys. Rev. B* 77, 045104 (2008); and L. Jylha et al., *J. Appl. Phys.* 99, 043102, 2006. While both of these methods introduce an additional degree of freedom that provides for the tuning of the resonances (in Kuester and Basilio by introducing a surrounding dielectric shell layer to a dielectric core and in Ahmadi and Jylha by introducing an additional resonator particle into the unit cell), unfortunately these two approaches can easily bring into question the applicability of effective media; this becomes particularly apparent at higher operating frequencies. In the case of the AB-type design, the size of the unit cell is physically extended (perhaps by a factor of two) to accommodate the additional resonator while, alternatively, in the core-shell design the electrical size of the resonator is forced to increase because overlap of only higher-order modes is possible. As the operating frequency is increased, an additional problem that arises in both these approaches (and any other all-dielectric designs) is that the range of available permittivities becomes much more limited. For example, in the long-wave infrared (8 μm-15 μm) the largest relative permittivities available in low-loss dielectric materials are in the range of 25-32, while relative permittivities in the hundreds (or higher) are common in the radio frequency part of the spectrum. See E. Palik, *Handbook of Optical Constants and Solids*, Academic, Orlando, Fla., (1986). To achieve resonance and still remain in the effective medium limit then becomes a difficult proposition. Nevertheless, as metamaterials designs are pushed to higher frequencies, the need for dielectric resonators is imperative since absorption associated with the metallic resonators becomes significant.

Therefore, a need remains for metamaterials based on dielectric resonators where degeneracy of the lowest-order magnetic- and electric-resonant modes can be realized and which consequently do not increase the lattice spacing.

SUMMARY OF THE INVENTION

The present invention is directed to negative-index metamaterials based on single-particle degenerate dielectric resonators. Various resonator embodiments can be realized by introducing high-contrast perturbations to the cavity geometry so as to bring the lowest-order electric and magnetic cavity resonances into frequency alignment (as opposed to higher-order modes on which previous core-shell dielectric designs are based). Since negative-index behavior can be demonstrated with only a single-type resonator (as opposed to dual particle or AB-type designs), these types of degenerate dielectric resonators potentially offer a size advantage so that the structure is less apt to fall outside the region where homogenization is applicable.

Therefore, the present invention is directed to a single-resonator unit cell design, which when assembled in a periodic array can be used to provide a double-negative metamaterial. Each resonator of each unit cell comprises at least one high-contrast inclusion in a dielectric structure for the purpose of shifting the lowest electric and/or magnetic resonances. For example, a high-permittivity inclusion, such as a metallic dipole, can shift the higher frequency, lowest-order electric resonance of the resonator toward a lower frequency and into alignment with the lowest-order magnetic resonance. The metallic dipole can be oriented parallel to the electric field associated with the first excited electric mode and oriented at a null of the electric field of the first magnetic mode. Alternatively, the inclusion can comprise a low-permittivity inclusion, such as a cut plane, thereby shifting the lower frequency, lowest-order magnetic resonance of the resonator to the higher frequency, lowest-order electric resonance. The cut plane can be oriented perpendicular to the electric field associated with the first magnetic mode and oriented to have no normal electric field from the first electric mode. Two or more cut planes placed rotationally about the incident electric field axis and placed at symmetry angles of the resonator to provide an azimuthally independent response. In addition, the resonator can also contain at least one high-permittivity inclusion, to shift the lowest-order electric resonance of the resonator to a lower frequency, and at least one low-permittivity inclusion, thereby simultaneously shifting the lowest-order magnetic resonance of the resonator to a higher frequency. The dielectric structure can be a simple spherical or rectangular cavity. Other shapes can also be used, but may be more difficult to design through numerical simulation. In the case of microwave frequencies, many low loss, high permittivity dielectric materials can be used, including $Zr_xSn_{1-x}TiO_4$. If infrared or visible frequencies are of interest, PbTe or Te can be used, for example. These high-permittivity materials enable high contrast inclusions, but other low-loss dielectric materials can also be used.

As examples of the present invention, different types of inclusions in spherical dielectric resonators for the purpose of changing the spectral positions of the lowest magnetic and electric resonant modes are described below. The frequencies and field distributions of the lowest spherical modes can be found through a boundary condition analysis and then cavity perturbation theory can be used to examine the types of inclusions that are useful in moving the two types of modes into alignment. Perturbation theory can also be used to arrive at approximate predictions for the modal shifts (in terms of frequency or wavelength) realized with particular inclusions. An embodiment with multiple inclusions is described that can be used to push the inherently lower-frequency magnetic resonance clear past the higher-frequency electric resonance; thereby illustrating negative-index behavior. Multiple cut inclusions create an effective anisotropic material to cause alignment of the modes. The inherent anisotropy of the resonator dielectric material can also be used to align the modes (for example, tellurium is naturally anisotropic and this anisotropy can be used to mimic the multiple cut inclusions and create self-degenerate structures). The spectral locations of the modes can be tuned to achieve other desired combinations of effective permittivity and permeability.

Other examples describe rectangular dielectric resonators that can be perturbed with inclusions to change the spectral positions of the lowest magnetic and electric resonant modes. The lowest modes can be selected in order to keep the resonator as electrically small as possible. In particular, rectangular resonators can be easier to fabricate by lithographic techniques in the infrared frequency range (as in the visible band). The frequencies and field distributions for rectangular dielectric resonators can be found through a waveguide approximation and numerical simulations. Perturbation theory can be used to arrive at approximate predictions for the modal shifts (in terms of frequency or wavelength) realized with particular inclusions. Resonator designs demonstrating modal degeneracy can be used for the construction of negative-index metamaterials at infrared wavelengths. However, the approach can also be used to tune the spectral locations of the modes to achieve other desired combinations of effective permittivity and permeability.

BRIEF DESCRIPTION OF THE DRAWINGS

The accompanying drawings illustrate the present invention and, together with the description, describe the invention. In the drawings, like elements are referred to by like numbers.

DETAILED DESCRIPTION OF THE INVENTION

The present invention is directed to negative-index metamaterial designs based on degenerate single-particle dielectric resonators, especially those operating at microwave through optical frequencies. According to the present invention, high- and low-permittivity inclusions are placed within a resonator volume to perturb the resonant frequencies into alignment. It is useful to select polarization-dependent perturbations of high contrast relative to the resonator material so that one of the modes is selected (by virtue of the associated electric-field orientation) to move the respective resonant frequency in the appropriate direction (ultimately bringing the two modes together).

Figure 1A:
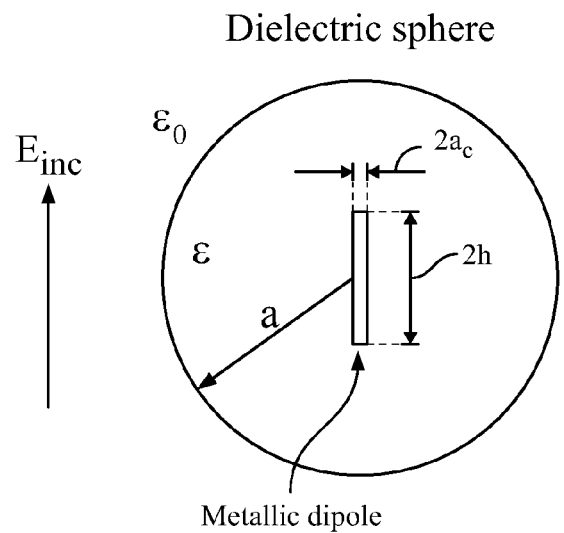
FIGS. 1A and 1B are illustrations of dielectric sphere and cube resonators comprising an embedded magnetic dipole. In order to realize a frequency downshift in the electric resonance (towards the magnetic resonance), a metallic dipole is embedded within the dielectric resonator (the outer medium in this figure has $\in_1=\in_o$). The dipole is oriented along the direction of the incident electric field.
Figure 1B:
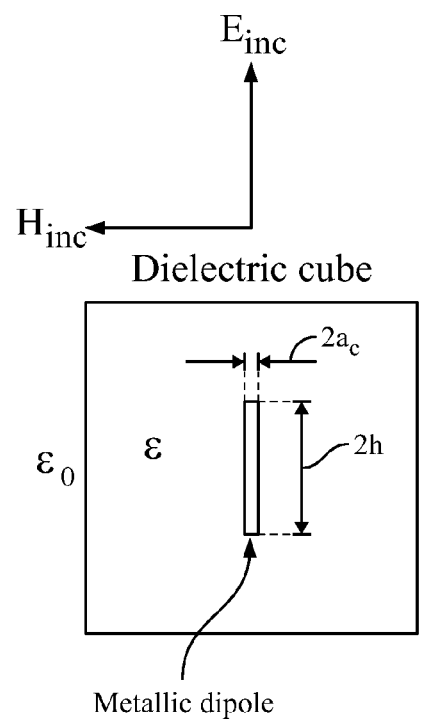

As shown in FIGS. 1A and 1B, high-permittivity inclusions can be realized with metallic dipoles which are oriented along electric field lines associated with the first excited electric mode (and ideally at a null of the electric field of the first magnetic mode), in order to shift the electric resonance downward in frequency (upward in wavelength) toward the first magnetic mode. The metallic dipole preferably comprises a low-loss metal and has an elongated shape, such as a rod or prolate spheroid, that selectively shifts the electric resonance but leaves the magnetic resonance unperturbed. More dipoles at other orientations can be added to provide a more isotropic response.

Figure 2A:
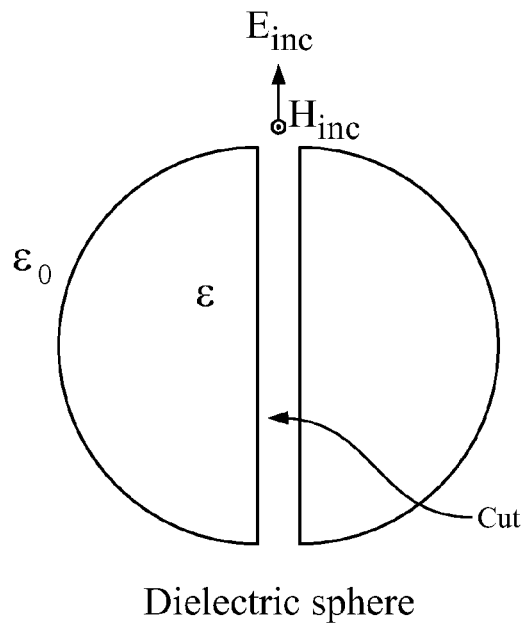
FIGS. 2A and 2B are illustrations of dielectric sphere and cube resonators comprising a split or cutout. A cutout along the center of the dielectric resonator can be introduced to upshift (in frequency) the magnetic resonance towards the higher frequency electric resonance. The cut plane contains both the electric and magnetic incident field (here the outer medium and cutout have $\in_1=\in_o=\in_p$).
Figure 2B:
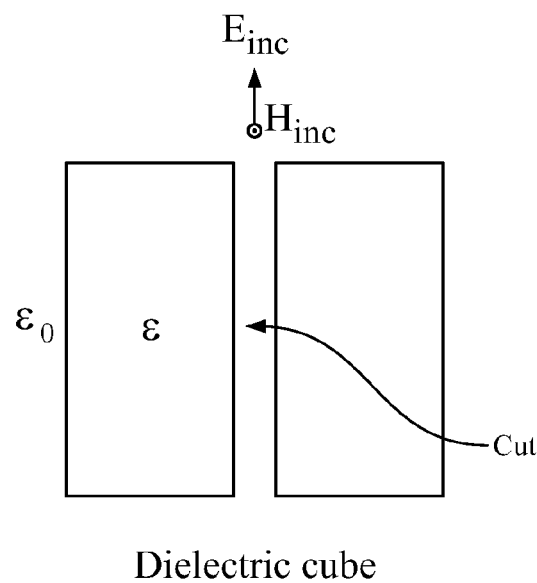

Alternatively, as shown in FIGS. 2A and 2B, low-permittivity inclusions can be conveniently realized by a cut oriented perpendicular to electric field lines associated with the lowest magnetic mode (and ideally having no normal electric field from the first electric mode). The cut can be a vacuum gap, an air split, or a gap filled with other gas, dielectric foam, or other low-loss, low-permittivity materials. Alternatively, the inclusion can be thin and have a pancake shape, such as an oblate spheroid. Preferably, the inclusion has a relative permittivity near one with no loss. With these types of perturbations, the first magnetic mode is shifted upward in frequency (downward in wavelength) toward the first electric mode. However, the amount of the frequency shift will eventually saturate as the size of the cut is increased. This effect can be overcome by using multiple inclusions within the dielectric resonator.

Figure 3:
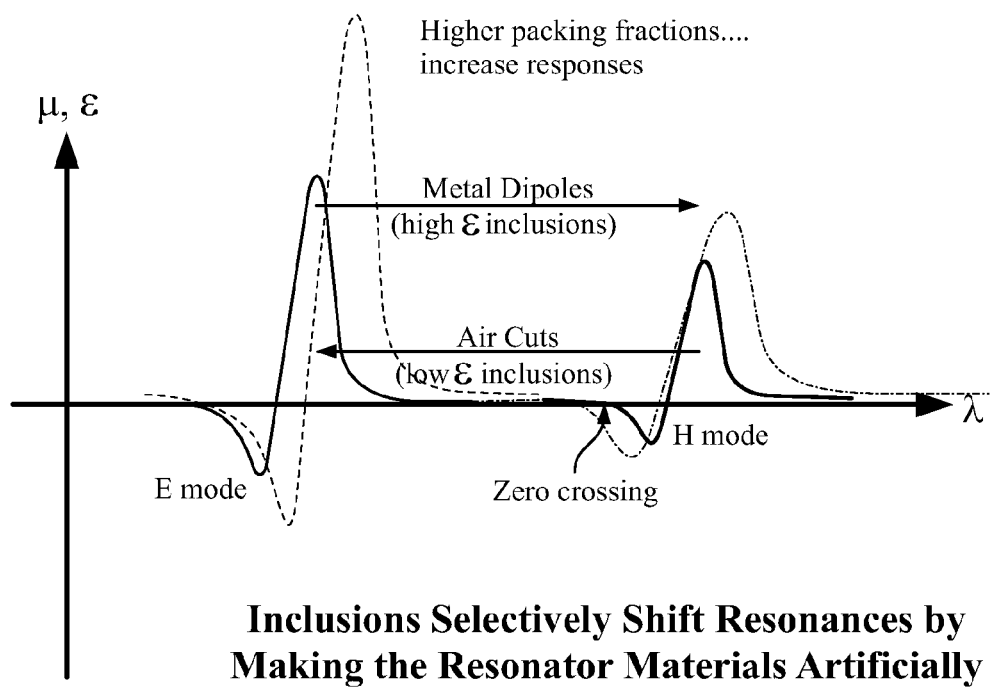
FIG. 3 is a graph illustrating resonance shifting due to various perturbation treatments.

The effects resulting from metal dipoles and air cuts on the dielectric resonator performance are summarized in FIG. 3. It is important to point out that, depending on the frequency range of interest, each of these designs offer different advantages in terms of ease of manufacturing, losses, and electrical size. For example, at microwave frequencies a dielectric resonator with a metallic dipole insert may be fairly easy to realize, without a significant deterioration in the loss performance. The reasonable maintenance of the loss performance, together with the fact that the electric size of the resonator becomes smaller as the electric mode is downshifted to lower frequencies (ultimately overlapping the magnetic resonance for negative-index performance), are clear advantages of this type of design. On the other hand, as the frequency is increased (i.e., the wavelength is decreased), air inclusions may become a more attractive option.

The two perturbing effects can be combined to overcome the above-mentioned shift saturation and allow smaller individual inclusions to be used; enable operation further from the peak of the resonances and realize loss reductions; and make the resulting design invariant with respect to incident plane wave angle. Further, to allow flexibility in precise alignment, as well as to operate further away from the large losses associated with the resonant peak region, the perturbed resonators can arranged to yield a larger packing fraction. With the extra response associated with the lattice arrangement, it is possible, for example, to achieve negative index in the tail regions of the two resonances where losses are lower. With a combination of perturbations including both cuts and dipoles, the magnetic resonance can be shifted to lower wavelengths (i.e., higher frequencies) at the same time that the electric resonance is shifted to higher wavelengths (i.e., lower frequencies) so that ultimately overlap is realized at an "in-between" wavelength. Finally, shift limitations can be overcome by introducing multiple cuts in the dielectric resonator. An advantage of this approach is that the response becomes independent of the azimuthal angle of incidence. For example, in a sphere the cuts can be arranged along longitude lines defined by the poles oriented in the direction of the incident electric field. Since the resulting first electric mode will not possess an azimuthal component (in the latitude direction), then the first electric mode will have no normal electric field with respect to the cuts. The extra cut planes at 45° angles also shift the magnetic quadrupole away from the operating frequency region, thereby lowering losses.

Various dielectric resonator designs are described below as examples of the present invention, where frequency degeneracy of the lowest-order magnetic and electric resonances is realized by introducing perturbations to the resonator in the form of metallic inclusions, air gaps, or combinations thereof. Since the magnetic resonance of these dielectric resonators always occurs at lower frequency than the electric resonance, a negative index of refraction (or double-negative medium) is not inherent to the single-particle, non-perturbed design. Thus, unlike the prior dielectric designs described in the Background section, which can suffer from size disadvantages associated with either extending the unit cell to include two particle-resonators or a reliance on higher-order resonances, the perturbed dielectric resonator designs of the present invention employ a degenerate single-particle design operating at its lowest-order magnetic and electric resonance (thereby constraining the electrical size of the unit cell) to obtain negative-index properties. Although the particular resonator designs presented herein incorporate inclusions so as to induce frequency alignment of the lowest-order modes, other applications of these perturbation-based resonators include those which require independent tuning of the constitutive parameters ($\in$, $\mu$) in combination with selective placement of the resonances at particular frequency positions.

Results based on isolated-particle simulations together with extraction of the Claussius-Mossatti effective medium parameters are described below for exemplary embodiments and a full-wave periodic simulation of a bulk layer is provided for one of the designs. See L. I. Basilio et al., *IEEE Antennas Wireless Propag. Letters* 10, 1567 (2011); and L. I. Basilio et al., *IEEE Antennas Wireless Propag. Lett.* 11, 113 (2012), which are incorporated herein by reference. The detailed theoretical analysis that has been used to arrive at the degenerate designs presented herein is provided in L. K. Warne et al., "Perturbation Theory in the Design of Spherical Dielectric Degenerate Metamaterial Resonators," *IEEE Trans. Antennas Propag.*, to be published; L. K. Warne et al., "Perturbation Theory in the Design of Degenerate Rectangular Dielectric Resonators," *Progress in Electromagnetics Research B*, to be published; and U.S. Provisional Application Nos. 61/536,937 and 61/622,870, each of which is incorporated herein by reference. These latter references describe a cavity-perturbation theory that can be used to ascertain the types of perturbations (in terms of polarization and placement within the resonator) that result in the necessary modal shifts to achieve degeneracy, and provide simple formulas that can be used for designing degenerate resonator metamaterials.

Spherical Dielectric Resonator with a Wire-Dipole Inclusion

Figure 4C:
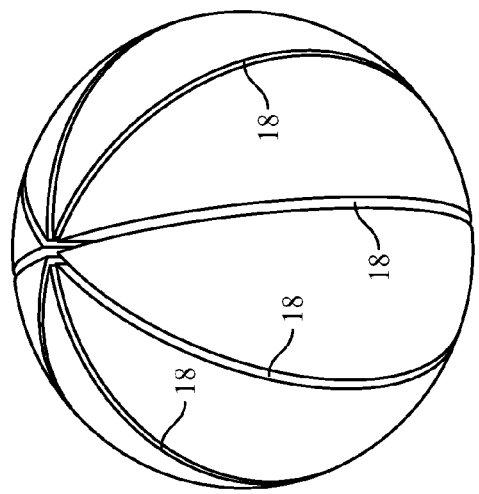
FIG. 4C is a schematic illustration of a spherical dielectric resonator with four air gaps positioned symmetrically around the pole axis.
Figure 4B:
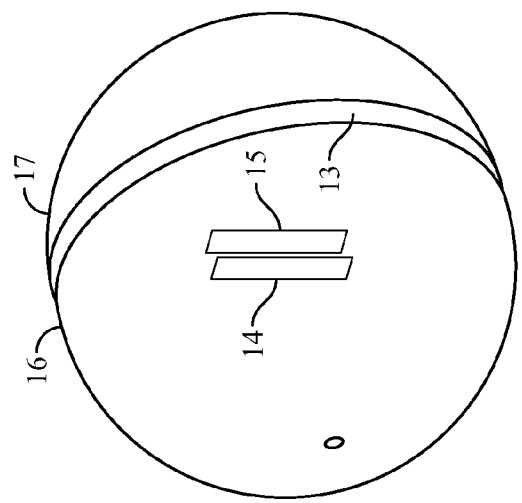
FIG. 4B is a schematic illustration of a spherical dielectric resonator containing an air split along its center (the plane of the split contains the incident field) and including a strip dipole on each face of the split.
Figure 4A:
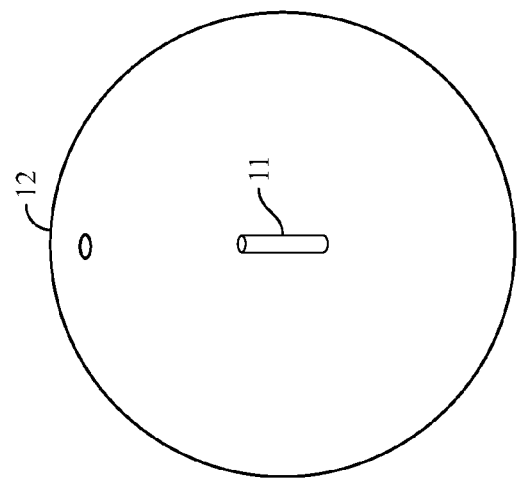
FIG. 4A is a schematic illustration of a spherical dielectric resonator with an embedded wire dipole positioned at the center of the sphere.

In the example shown in FIGS. 1A and 4A, a metallic dipole 11 oriented along the electric field lines of the first-order (lowest frequency) resonant electric mode is placed at the center of a dielectric sphere 12, so that a frequency downshift of the electric resonance yields modal overlap with the first-order magnetic mode. Whereas previous efforts have introduced metallic inclusions to establish gradient properties in a lens design, here the metallic insert is being used to realize modal degeneracy in a single resonator for negative-index performance. See X. Q. Lin, *Appl. Phys. Lett.* 92, 131904 (2008). The perturbed resonator geometry shown in FIG. 4A is referred to herein as the SphWD design.

Figure 5:
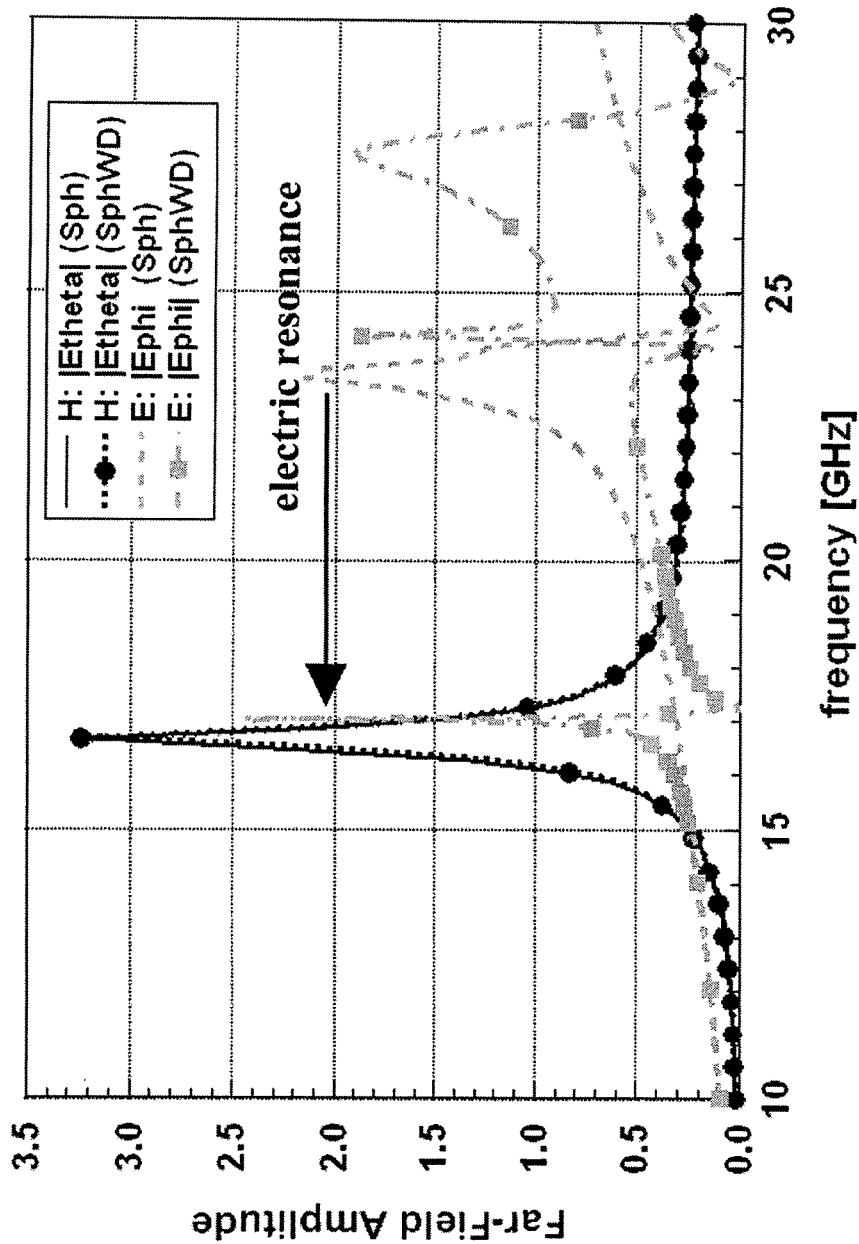
FIG. 5 is a graph of the scattered far-field amplitudes generated by the perturbed resonator shown in FIG. 4A when illuminated by a superposition of plane-waves such that a predominately H-excitation ('H') or a predominately E-excitation ('E') of the resonator results. See J. B. Pendry et al., IEEE Trans. Microwave Theory Tech. 47 (1999). Scattering results for the unperturbed dielectric sphere are also included.

FIG. 5 shows the simulated far-zone scattered amplitude responses as a function of frequency when a single ZST ($Zr_xSn_{1-x}TiO_4$) resonator is illuminated by a superposition of plane waves set up to create a cancellation of either the electric or magnetic field at the center of the resonator. See Basilio (2011). In this design, the perturbed resonator (SphWD) has the properties of a relative permittivity $\in_r=(38.0, -0.019)$, sphere radius a=1.44 mm, dipole length $L_d$=1.152 mm, and dipole radius $a_d$=0.05 mm. For simplicity, the dipole here has been assumed to be perfectly conducting. (With the resonator orientations shown in FIGS. 4A-4C and incident plane-wave polarizations of $H_x$ and $E_y$, the far-field amplitudes described herein are sampled on the $\theta=\pi/2$ plane at $\phi=\pi/2$ for the magnetic response and $\phi=0$ for the electric response.) With results for an unperturbed ZST sphere (Sph) also being included in FIG. 5, it is clear that while the magnetic and electric resonances occur at 16.7 and 23.3 GHz, respectively, for the unperturbed case, the presence of the dipole (positioned in the particular location and orientation shown in FIG. 4A) selectively shifts the lowest-order electric resonance to a lower frequency so that near alignment between two lowest-order modes occurs (the lowest-frequency magnetic mode remains essentially fixed at 16.7 GHz). Thus, this design has the advantages of keeping the sphere resonator as electrically small as possible (double-negative behavior occurs near the lowest-order magnetic resonance), as well as being relatively easy to fabricate.

Figure 6:
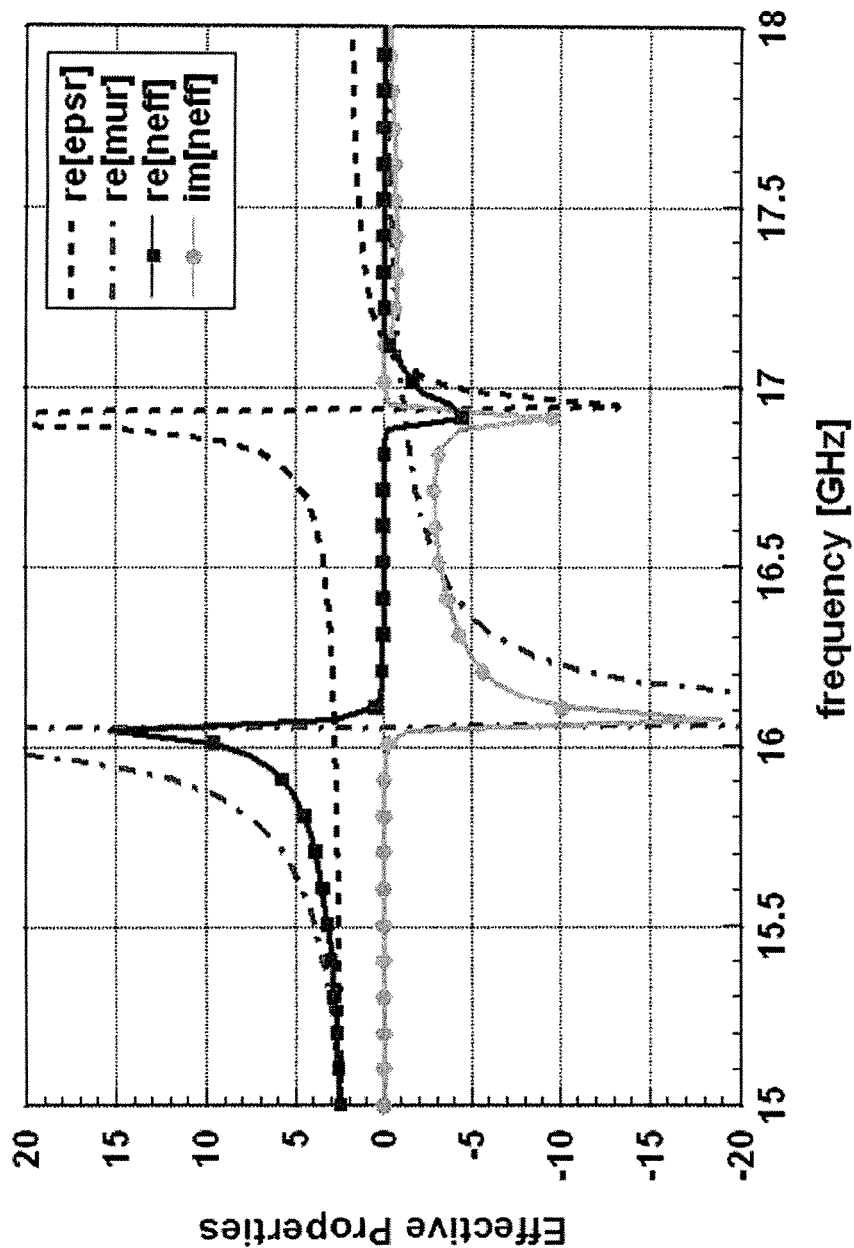
FIG. 6 is graph of the effective-medium parameters for the design of FIG. 4(a) with $\in_r=(38.0, -0.019)$, a=1.44 mm, $L_d$=1.152 mm, and $a_d$=0.05 mm and a 30% volume packing fraction (corresponding to a lattice spacing of 3.47 mm). For plot clarity, only the real parts of $\in_r$ and $\mu_r$ are provided, together with the real and imaginary parts of the effective refractive index.

The Claussius-Mossatti effective-medium parameters ($\in$, $\mu$) can be computed by extracting the dipole moments from the scattered far-zone patterns, and the results for a frequency range about the resonances are shown in FIG. 6. See Basilio (2011). Here, it is evident that with the scattered peak alignment given in FIG. 5 and a volume packing fraction of 30%, negative-index behavior (corresponding to the real parts of the effective permeability and permittivity both being negative) for this SphWD design occurs in the frequency band between 16.9 and 17.1 GHz. It is important to note that for the purpose of realizing lower loss performance, the relative positioning between the magnetic and electric responses shown in FIG. 5 has been selected so as to realize overlap in the tail regions (negative side) of the constitutive parameters (as opposed to overlap in the negative peaks). From FIG. 6, the imaginary part of $n_{eff}$ is shown to approach zero for frequencies greater than about 17 GHz, where at 17.05 GHz the real part of the effective refractive index is approximately equal to −1. Specifically at 17.05 GHz, the design is characterized by $n_{eff}$=−1.12−j0.05, which corresponds to an attenuation of 2.7 dB/$\lambda_o$ (where $\lambda_o$ is a free-space wavelength) and an effective lattice spacing of b|$n_{eff}$|/$\lambda_o$=0.22 (b/$\lambda_o$ is slightly smaller at 0.20).

Spherical Dielectric Resonator with an Air Split and Strip-Dipole Perturbation In the previous example, one inclusion type was employed to selectively frequency-shift one resonance (electric) while leaving the other (magnetic) unperturbed. If minimizing the size of the perturbations is of interest (in accordance with fabrication issues or loss considerations, for example), an alternative method to be considered introduces multiple perturbations so as to simultaneously frequency shift the resonances towards each other and ultimately realize overlap at some intermediate frequency to the fundamental ones (16.7 and 23.3 GHz for the unperturbed ZST resonator described in the previous section). FIG. 4B shows an example in which a cut or air split 13 perpendicular to the direction of propagation (and parallel to the plane containing the incident plane-wave polarizations) is used to interact with the lowest-order magnetic resonance, while two strip dipoles 14 and 15 oriented along the incident electric field are placed on each flat face of the two hemispheres 16 and 17 for interaction with the lowest-order electric resonance. (Here, two strip dipoles are employed for symmetry purposes only; a single strip dipole could also be used.) The perturbation-based approach of FIG. 4B is referred to as the split sphere-strip dipole (SplSphSD) design.

Figure 7:
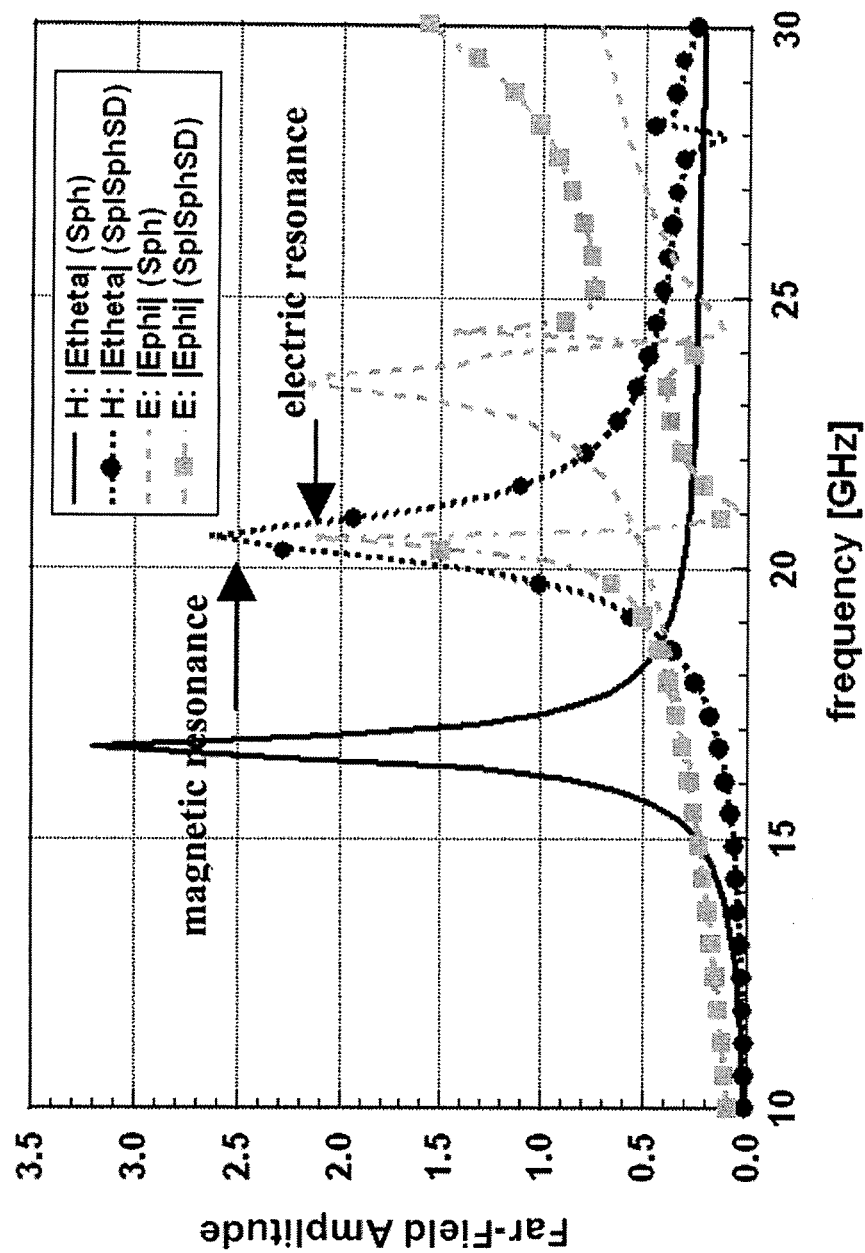
FIG. 7 is a graph of the scattered far-field amplitudes generated by the perturbed resonator shown in FIG. 4(b) when illuminated by a superposition of plane waves such that a predominately H-excitation ('H') or a predominately E-excitation ('E') of the resonator results. See J. B. Pendry. Scattering results for the unperturbed dielectric sphere are also included.

The frequency positions of the resonances for the design of FIG. 4B with parameters $\in_r$=(38.0, −0.019), sphere radius a=1.44 mm, split size s=0.1 mm, strip length $L_s$=0.9 mm, and strip width $w_s$=0.2 mm can be identified from the far-zone scattered amplitude responses given in FIG. 7. For simplicity, the strip dipole is initially considered to be lossless and infinitesimally thin. (The scattering results corresponding to the unperturbed sphere are provided for comparison.) Thus, with this dual-perturbation approach, the peak scattered amplitudes that were originally positioned at 16.7 and 23.3 GHz are seen to merge together and, with the design parameters specified above, align at approximately 20.5 GHz. Although a plot of the effective-medium parameters (found by the procedure described in Basilio (2011)) is not shown here, this particular SplSphSD design in a 30% volume arrangement yields a refractive index of $n_{eff}$=−1.03−j0.04 at 20.6 GHz; this corresponds to an attenuation of 2.0 dB/$\lambda_o$ and an effective lattice spacing of b|$n_{eff}$|/$\lambda_o$=0.25. (For this design, the region of negative refraction occurs between about 20.2 and 20.6 GHz.)

As shown in FIG. 2A, a perturbation design based on an air-split alone (not including the strip dipoles) can be used to shift the magnetic resonance up towards the higher-frequency electric resonance (which remains fixed), as described in L. K. Warne et al., "Perturbation Theory in the Design of Spherical Dielectric Degenerate Metamaterial Resonators," *IEEE Trans. Antennas Propag.*, to be published. However, the amount of the frequency shift will eventually saturate as the size of the air split is increased. The effect of the shift saturation is that the tuning range becomes limited and modal alignment may not be possible with the air-split alone. Thus, an attractive feature of a dual-perturbation design is that this saturation effect is eluded and also that electric size of the resonator is kept smaller by realizing modal alignment at an intermediate frequency (rather than at the higher frequency of the fundamental electric resonance as with the single air-split design).

Spherical Dielectric Resonator with Multiple Air Gaps

Since an all-dielectric design may be desirable, an alternative to the SplSphSD design that also overcomes saturation effects is shown in FIG. 4(c). With four equally sized air splits 18 placed rotationally about the sphere axis (in 45° increments), it is worth noting that this example (4SplSph) offers the added advantage of having an azimuthally independent response. As one might expect, the presence of the multiple splits increases the sensitivity of the modal shifting and actually allows for the magnetic resonance to be tuned beyond the electric resonance.

Figure 8:
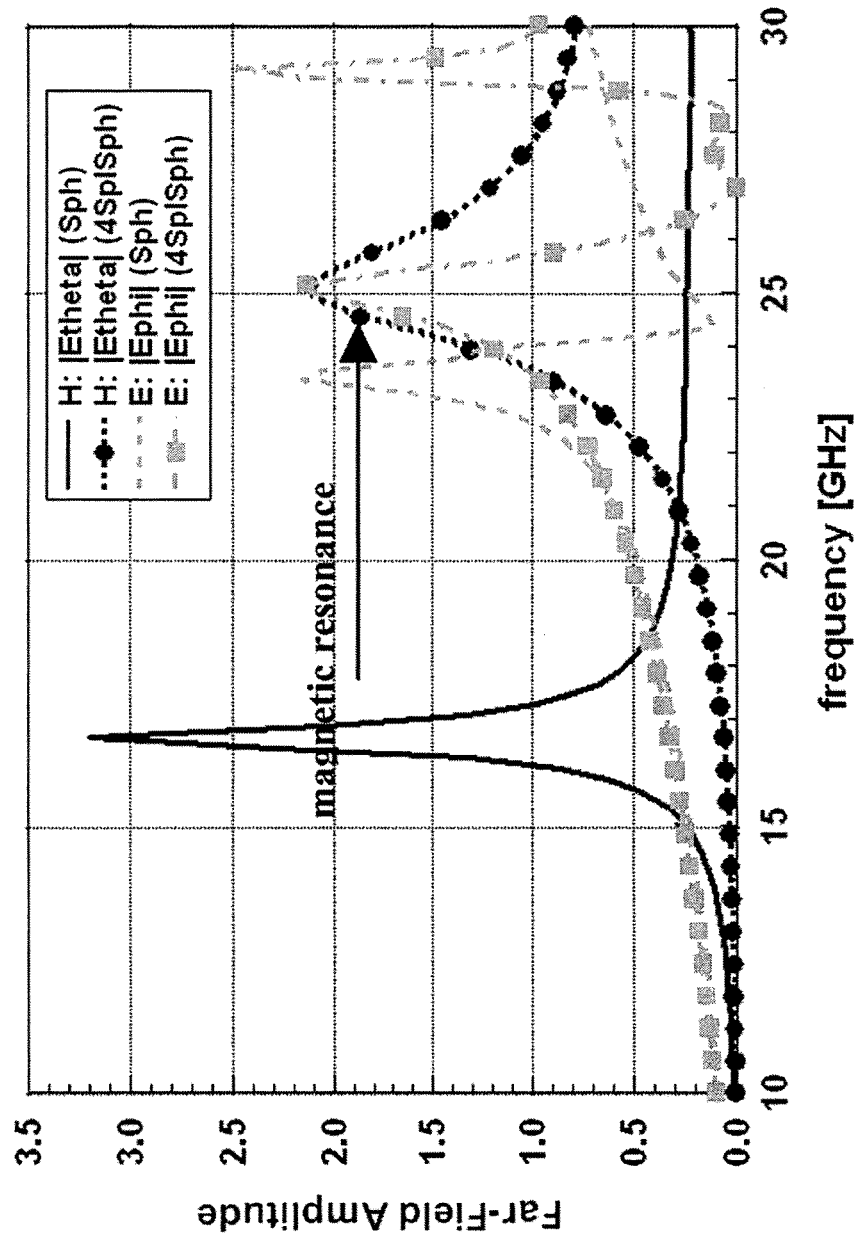
FIG. 8 is a graph of the scattered far-field amplitudes generated by the perturbed resonator shown in FIG. 4(c) when illuminated by a superposition of plane-waves such that a predominately H-excitation ('H') or a predominately E-excitation ('E') of the resonator results. See J. B. Pendry. For comparison, the scattering results for the unperturbed dielectric sphere are also included.
Figure 9:
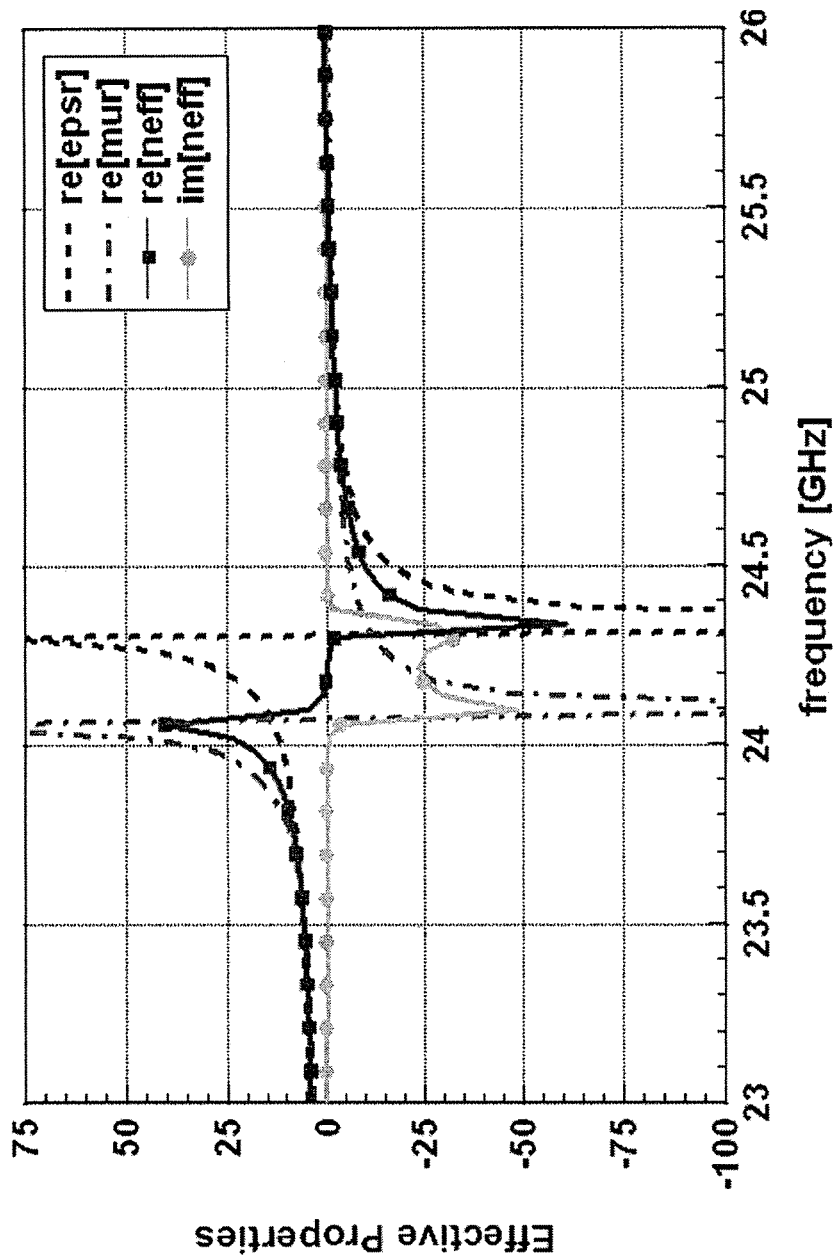
FIG. 9 is a graph of the effective-medium parameters for the design of FIG. 4(c) with $\in_r=(38.0, -0.019)$, a=1.44 mm, and s=0.1 mm and a 30% volume packing fraction. For plot clarity, only the real parts of $\in_r$ and $\mu_r$ are provided, together with the real and imaginary parts of the effective refractive index.

The far-zone scattered responses for a four-air-split sphere resonator characterized by $\in_r$=(38.0, −0.019), sphere radius a=1.44 mm, and splits of s=0.1 mm are shown in FIG. 8. For this particular design, alignment of the peak amplitudes corresponding to the magnetic and electric field excitations is found to occur at approximately 25 GHz, thereby yielding the Clausius-Mossatti parameters shown in FIG. 9 for a packing fraction arrangement of 30%. Negative-index behavior is observed in the band between 24.3 and 25.7 GHz, where at 25.3 GHz the refractive index is given by $n_{eff}$=−1.05−j0.01; this corresponds to an attenuation of 0.5 dB/$\lambda_o$ and an effective lattice spacing of b|$n_{eff}$|/$\lambda_o$=0.3. It is significant to note that of the three examples presented herein the 4SplSph design is characterized by the largest negative-refraction bandwidth and consequently the smallest loss values (since it is possible to operate farther away from the peaks with a larger bandwidth design).

Verification of Design Performance: Spherical Dielectric Resonator with Wire-Dipole Inclusion For the purposes of verifying the predicted performance of the perturbed resonator designs, a bulk layer of five spheres along the direction of propagation (with infinite periodicity in the lateral directions) was simulated with the massively paralleled, frequency-domain integral equation code EIGER. See W. Johnson et al., "EIGER: An Open-Source Frequency Domain Electromagnetics Code", IEEE APSSymp., Honolulu, Hi., USA, 2007. A full-wave simulation of a bulk layer based on the SphWD design (with a packing fraction of 30%) is described below.

Figure 10:
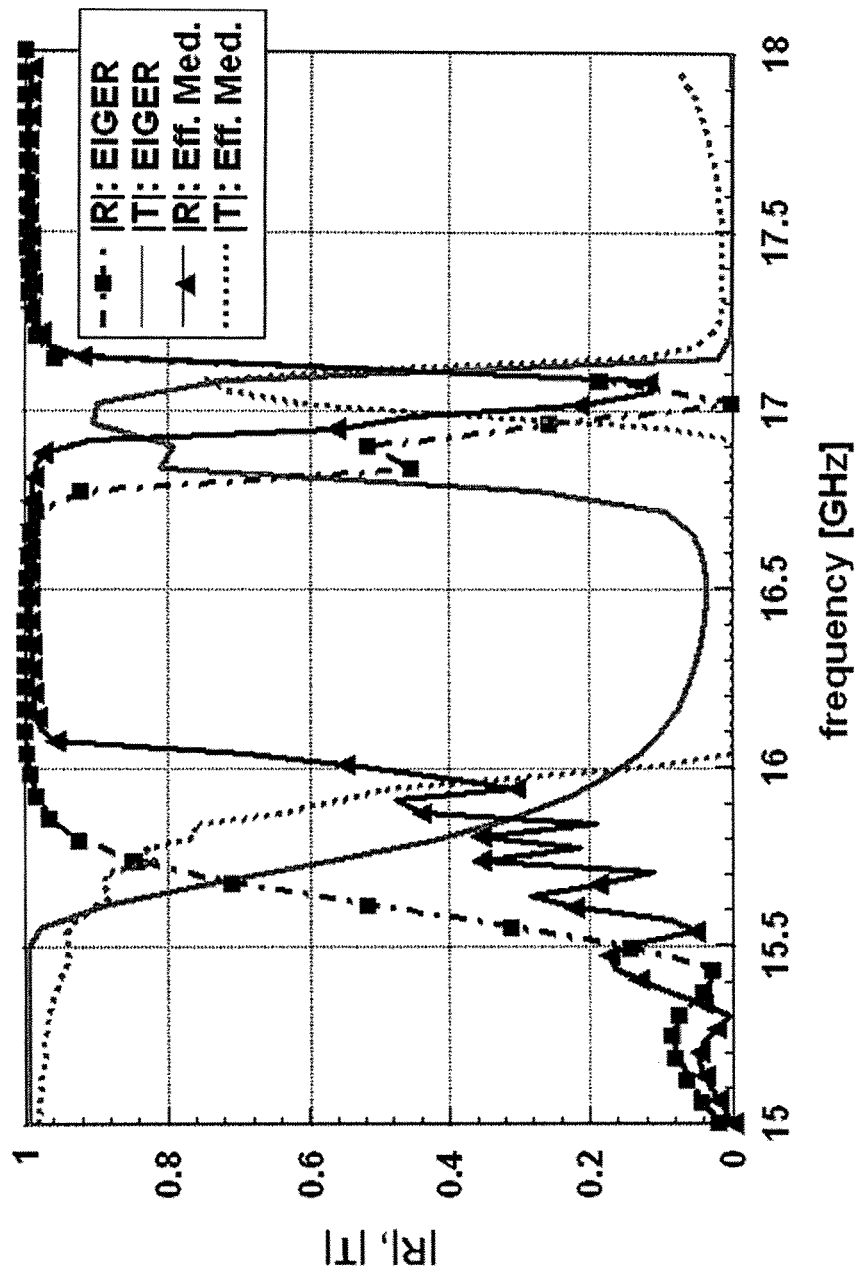
FIG. 10 is a graph of the simulated reflection and transmission coefficient characterizing a stack of five unit cells of FIG. 4(a) in the direction of propagation, with infinite periodicity (period=3.47 mm). Results obtained from the periodic simulation (EIGER) and that based on the effective-medium parameters (FIG. 9) are shown.

FIG. 10 shows a comparison of the reflection (R) and transmission (T) coefficients for a 5-deep layer obtained from the periodic simulation and that obtained for a 5-deep layer homogenized with the properties shown in FIG. 6. (It is important to point out that the objective of running the full-wave simulations was to ultimately generate the retrieved effective-media results on the outskirts of the resonance, where homogenization is permissible.) Although a level difference and bandwith discrepancy is present, the overall behavior of R and T is in reasonable agreement for the two sets of results. (The oscillations in the effective-media results are expected since a static host is assumed in the analytic treatment.) Most notably, a transmission band about 17 GHz is seen to occur in the full-wave simulation; this is in accordance with the negative-index band predicted in FIG. 6 as well as with the transmission coefficient calculated for the bulk homogenized material (FIG. 10).

Rectangular Dielectric Resonators

As discussed above, the modes of dielectric resonators are typically interlaced in frequency, with the lowest magnetic resonance occurring before (lower frequency) the lowest electric resonance. In the discussion below, rectangular resonators (i.e., a rectangular prism) are treated as isolated (corresponding to lower packing fractions in the periodic lattice) and the effects of the periodic lattice are discussed where appropriate. To illustrate the invention, rectangular PbTe dielectric resonators at infrared frequencies where the relative permittivity is given by $\in_r=32.04+i0.0566$ (where $\in_r=\in/\in_0$ and $\in_0=8.854188$ pF/m is the free space permittivity) are considered as examples. See E. Palik, *Handbook of Optical Constants and Solids*, Academic, Orlando, Fla., (1986). (For simplicity in the theoretical analysis, only the real part of the PbTe permittivity is considered. Note that, to keep the unit cell as small as possible, it is preferable to use a dielectric resonator with a high permittivity). All simulations were generated using the integral-equation, method-of-moments code EIGER.

A global coordinate system was conveniently used for the incident plane wave and the array of particles, and two local coordinate systems attached to a single particle. The global system had x in the direction of the incident magnetic field, y in the direction of the incident electric field, −z in the direction of the incident wavevector (direction of the incident wave), and the origin was taken at the center of one particle. This global coordinate system was used in all the simulations that follow. Since the modes in the resonators naturally separate into transverse electric (TE) and transverse magnetic (TM), in the theoretical analysis it is convenient to use two local coordinate systems where the z axis is aligned with the direction of the incident magnetic field (TE), or alternatively with the incident electric field (TM). These local coordinates are used in the sections where the modal fields and the inclusions are discussed. These sections use a, b, and c, for the half dimensions of the rectangular resonator along the local x, y, and z directions, respectively, and do not permute the dimensions (which would have to be done for a rectangular geometry to make the link to the global coordinate system). This approach is taken since the discussion is primarily interested in a cubic resonator.

Unperturbed Rectangular Dielectric Resonator

It is important to note that while the spectral locations of the resonances determined from a single-particle simulation are directly correlated with the transmission coefficient associated with a periodic assembly of the resonators (an example of this is described below), a simulation of an isolated resonator can be used to also identify the nature of the resonance (electric versus magnetic and dipole versus quadrupole). This additional information (together with the resonant wavelength) can be used to design a degenerate perturbed resonator with overlapping lowest-order magnetic and electric resonances and which ultimately demonstrates negative-index behavior.

Figure 11:
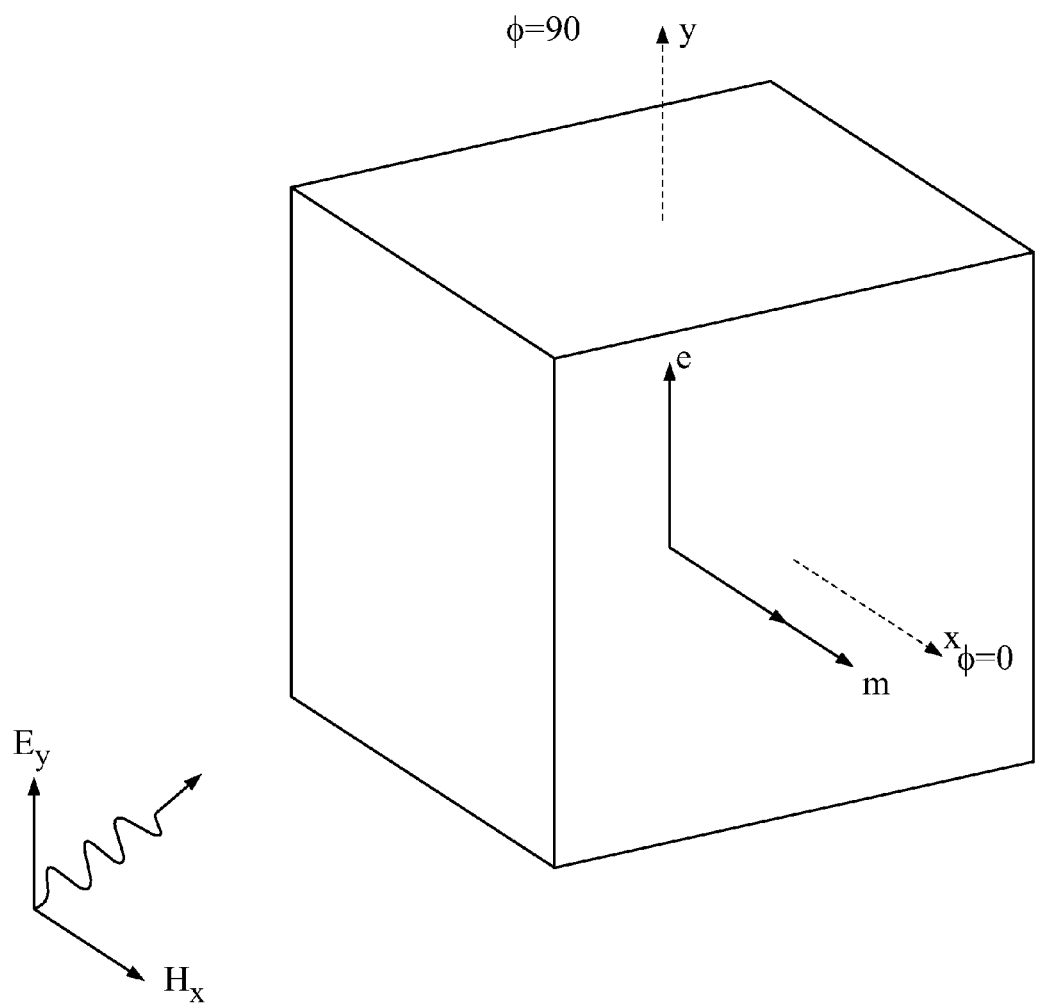
FIG. 11 shows the coordinate system and excitation used in the rectangular resonator simulations.
Figure 12:
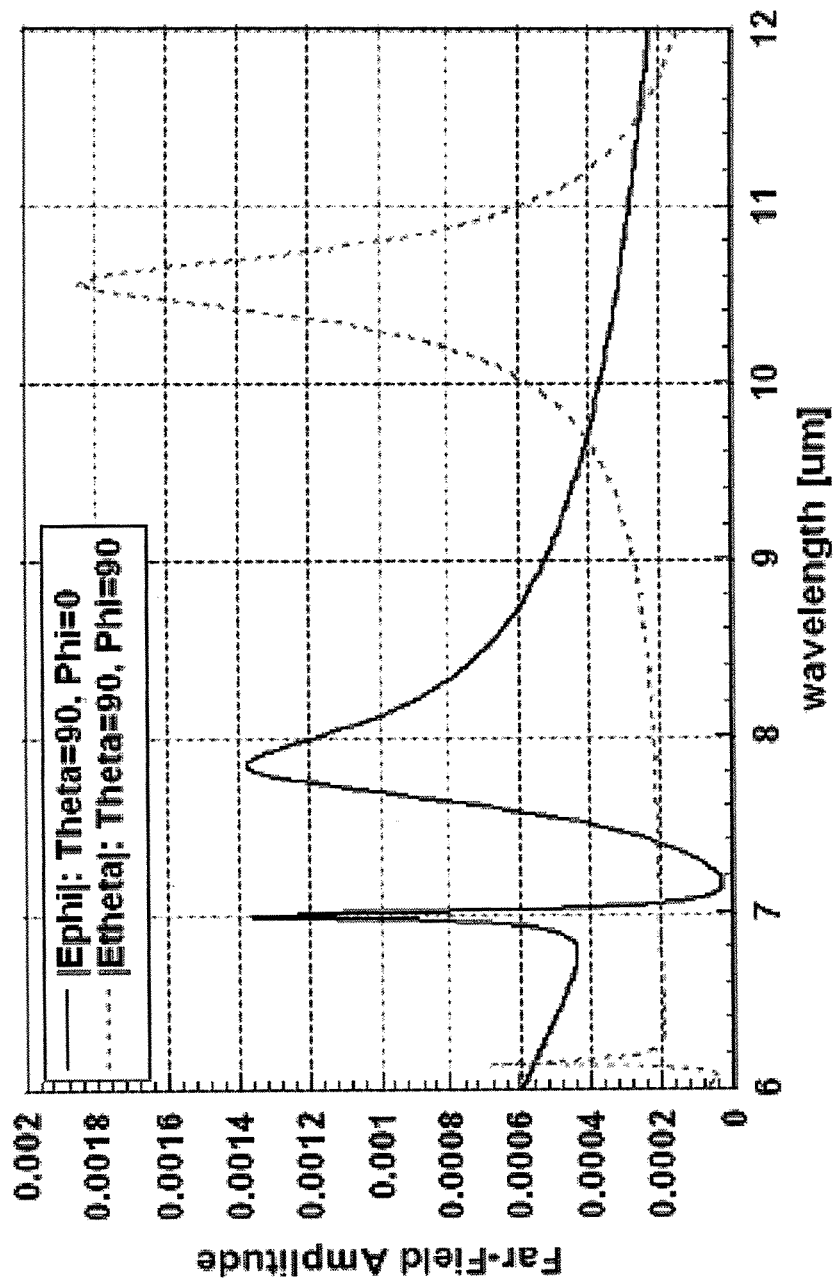
FIG. 12 is a graph of the radiated far-field amplitudes of a single PbTe ($\in_r$=32.04+i0.0566) cubic resonator of side length 1.53 μm. Sampling positions are located on the θ=90° plane at φ=0° and 90°.

In general, the far-zone radiation patterns of the isolated resonator can be used to extract the magnetic and electric polarizabilities and ultimately determine the constitutive parameters describing an effective media comprised of an infinite array of these resonators. Thus, for the simulations, a single resonator excited with the plane-wave orientation shown in FIG. 11 was considered. (To facilitate the interpretation of the response, a superposition of plane waves was set up to create a cancellation of either the electric or magnetic field at the center of the resonator.) Following the same procedure as described in Basilio (2011) and implemented in Basilio (2012), the resonant wavelengths were determined by the peaks in the far-zone scattered fields generated by the isolated resonator. The results for a PbTe cubic resonator of side length 1.53 μm are shown in FIG. 12 (sampled on the θ=90° plane for ϕ=0° and 90°), where peaks in the far-field amplitude (for the isolated particle) are seen to occur at 10.6 μm, 7.8 μm, and 7.0 μm.

Figure 13:
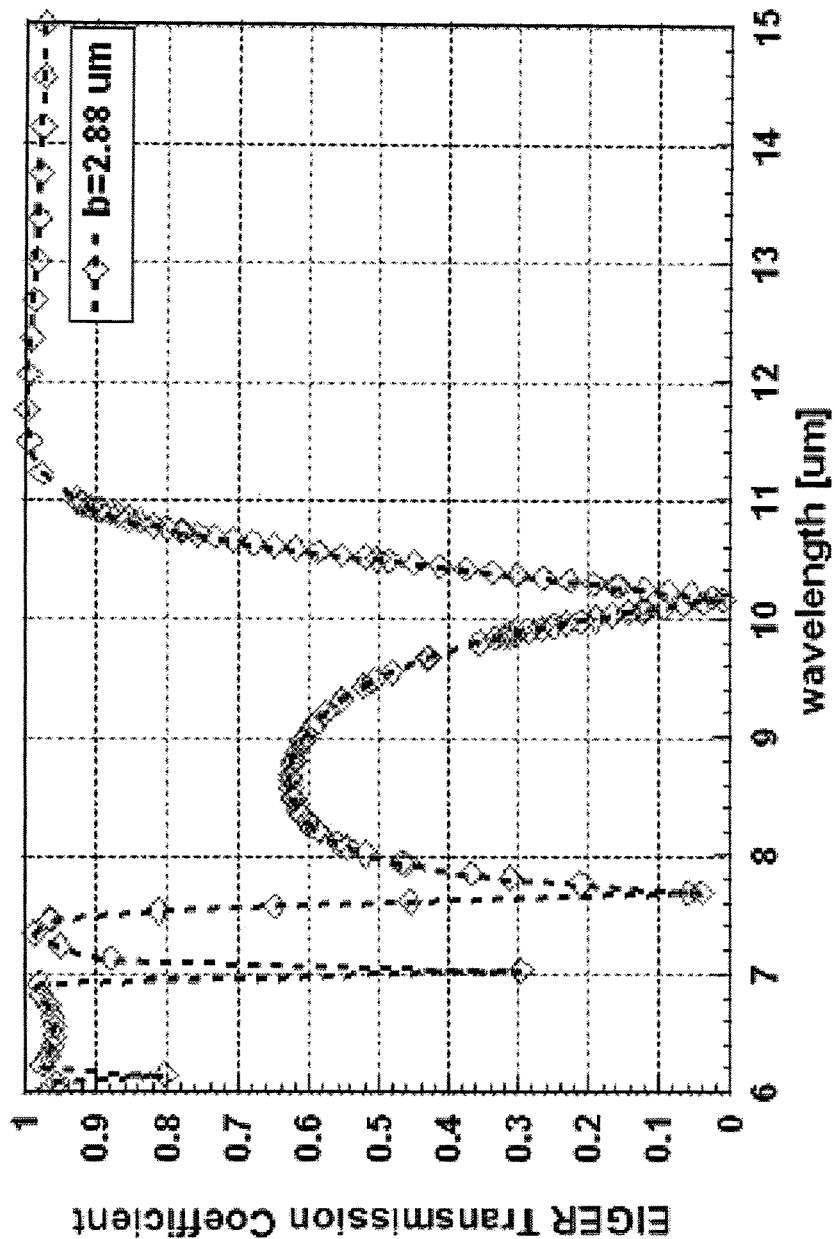
FIG. 13 is a graph of the transmission coefficient for an array of PbTe cubic resonators (of side length 1.53 μm) with period 2.88 μm.

FIG. 13 shows the transmission coefficient for a periodic array (single layer) of PbTe cubic resonators arranged with a volume-packing fraction of 0.15. Here the minima of the transmission coefficient are seen to occur at wavelengths in the vicinity of those yielding peaks in the far-field amplitudes shown in FIG. 12. (Note that due to the periodic loading the magnetic resonance is slightly shifted in position relative to the isolated resonator case.)

Figure 14:
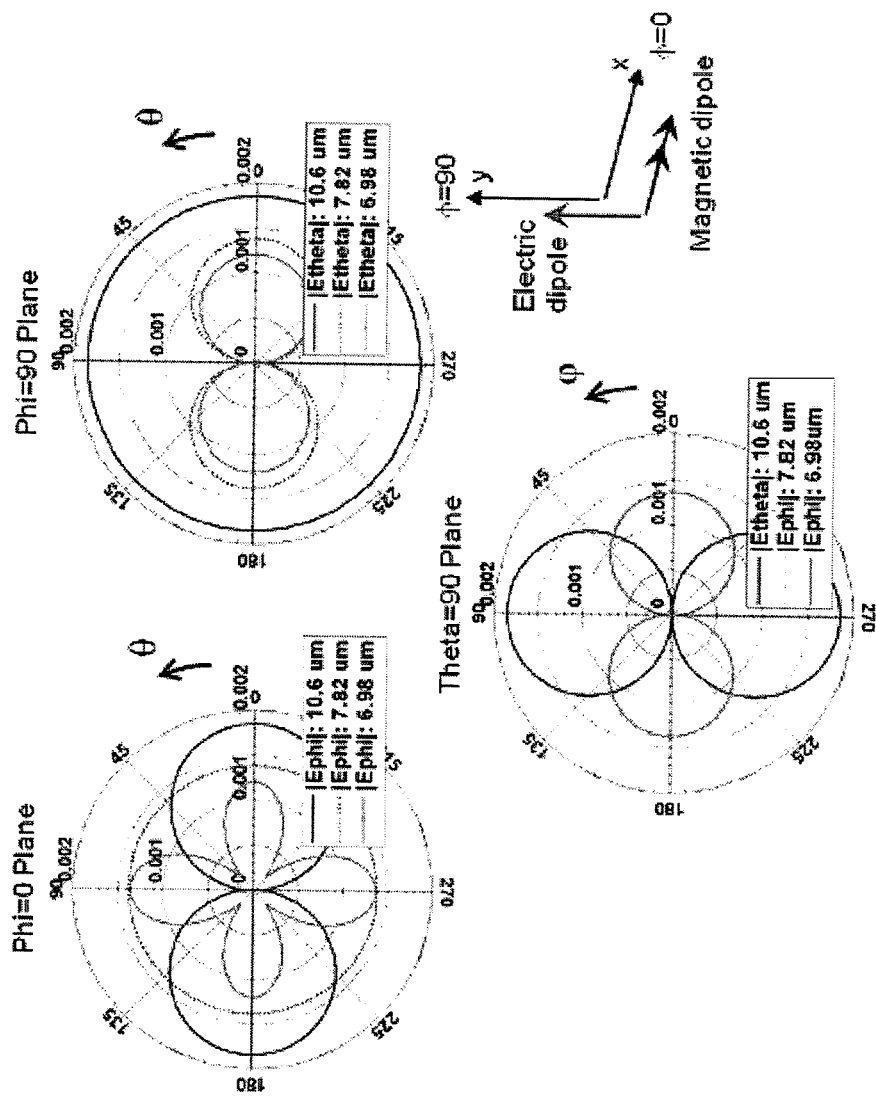
FIG. 14 shows the radiation patterns associated with a cubic PbTe resonator at each of the peak frequencies determined from the results in FIG. 12. In order of decreasing wavelength, the radiation patterns indicate that a magnetic dipole, electric dipole, and magnetic quadrupole characterize the cubic resonator within this spectral band.
Figure 15:
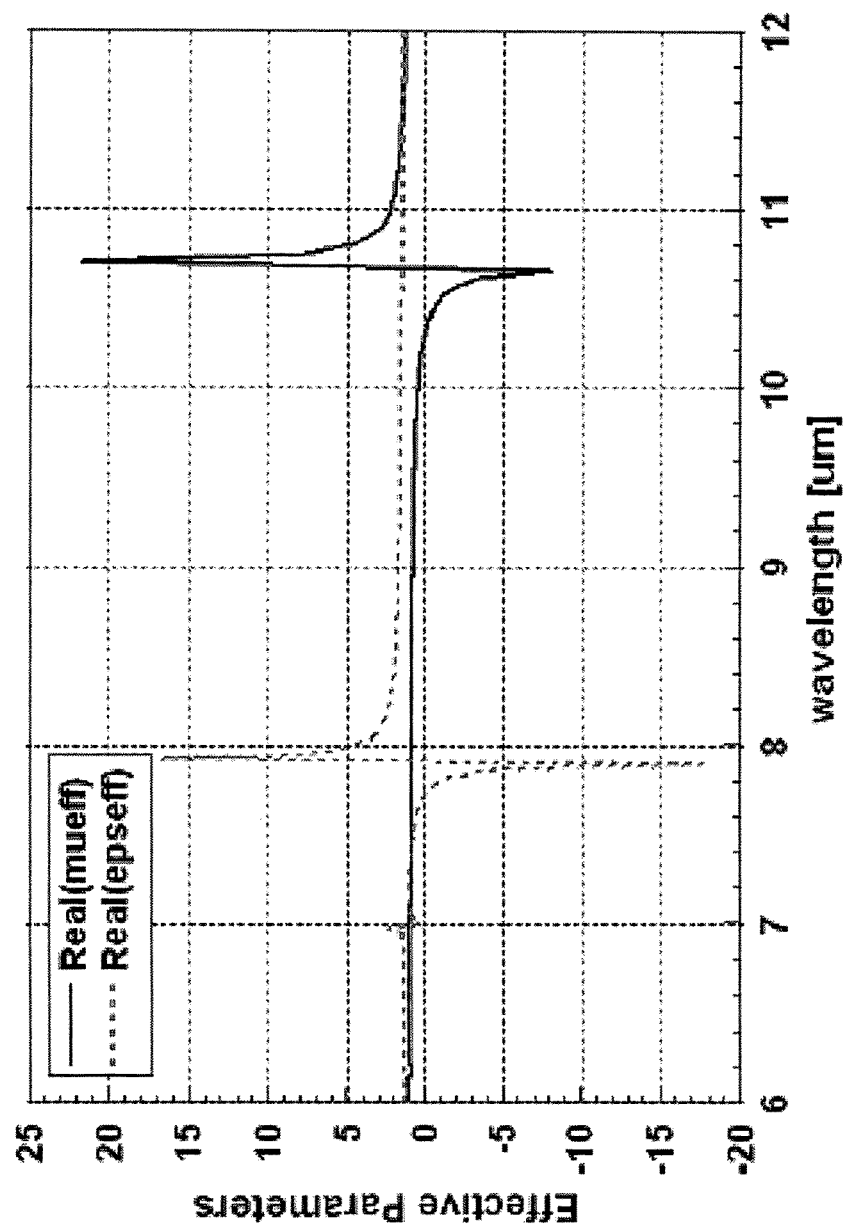
FIG. 15 is a graph of the extracted effective permeability and permittivity (relative to free space) for a PbTe cube of side length 1.53 μm. For simplicity, only the real parts of the effective parameters are shown.

As in Basilio (2011) and Basilio (2012), the far-field scattered patterns were used to extract the dipole moments of the isolated resonator. The scattered patterns (corresponding to a superimposed plane-wave excitation in Basilio (2011)) sampled at each of the wavelengths identified from FIG. 12 are plotted in FIG. 14. These pattern results were used to extract the effective-media parameters (see L. Jylha et al., *J. Appl. Phys.* 99, 043102 (2006); and E. Palik, *Handbook of Optical Constants and Solids*, Academic, Orlando, Fla., (1986)), shown in FIG. 15, for a cubic array of PbTe cubes (of side length 1.53 μm) with period 3.30 μm. The magnetic dipole as well as the electric-dipole resonances are clearly indicated in the effective permittivity and permeability response (the quadrupole effect at 7 μm is due to the single-point polar sampling used to approximately determine the dipole moments. See Basilio (2011). In addition, the spectral locations for the effective-media resonances are nicely correlated with the single-particle simulations.

Perturbed Cubic Dielectric Resonator

As described below, the cavity-field structures of the cubic dielectric resonator can be manipulated (via perturbations) so that overlapping lowest-order electric and magnetic modes is achieved. With this type of single-resonator degenerate design, a metamaterial realizing negative-index behavior and satisfying effective-media constraints can be determined.

One approach to alignment of resonances is to place inclusions within the resonator volume in an effort to perturb the resonant frequencies into alignment. It is useful to select polarization-dependent perturbations of high contrast relative to the resonator material so that one of the modes is selected (by virtue of the associated field orientation) and the respective resonant frequency is shifted in the appropriate direction. High-permittivity inclusions can be realized with metallic dipoles which are oriented along electric field lines associated with the first excited electric mode (and ideally at a null of the electric field of the first magnetic mode) as shown in FIG. 1B. (Note that, since PbTe is the highest permittivity material available in the infrared, it is necessary to use a metallic inclusion to obtain high contrast). This type of perturbation has the effect of shifting the electric resonance downward in frequency toward the first magnetic mode. Whereas these inclusions are used herein to obtain single-particle degeneracy (as in Warne (to be published) and Basilio (2012) for spherical resonator designs), inclusions of this type have been used previously to establish gradient properties for a lens design. See X. Q. Lin et al., *Appl. Phys. Lett.* 92, 131904 (2008).

Alternatively, low-permittivity inclusions can be realized by splits (or cuts), filled with gas or other low-permittivity materials, oriented perpendicular to electric field lines associated with the lowest magnetic mode (and ideally having no normal electric field from the first electric mode). With the type of perturbation shown in FIG. 2B, the first magnetic mode is shifted upward in frequency toward the first electric mode. Dielectric inclusions of this type have been used previously for bandwidth enhancements and tuning purposes. See Y. M. M. Antar and D. Guha, "Composite and Hybrid Dielectric Resonator Antennas: Recent Advances and Challenges," 23$^{rd}$ National Radio Science Conference, Menoufiya University, Egypt, Mar. 14-16, 2006; Y. M. Poplavko et al., *IEEE Trans. on Microwave Theory and Tech.* 49(6), (2001); and A. Derneryd et al., "Dual-Polarized Dielectric Resonator Antennas for Base Station Applications," 5th European Conference on Antennas and Propagation, Rome, Italy (2011).

The effects resulting from metal inclusions and air splits (or cutouts) on the dielectric resonator performance are illustrated pictorially in FIG. 3. Specific rectangular design examples are described below. Depending on the frequency range of interest, each of these designs offer different advantages in terms of ease of manufacturing, losses, and electrical size. For example, at microwave frequencies a resonator with a dipole insert may be fairly easy to realize, without a significant deterioration in the loss performance. The reasonable maintenance of the loss performance, together with the fact that the electric size of the resonator becomes smaller as the electric mode is downshifted to lower frequencies (ultimately overlapping the magnetic resonance), are clear advantages of this type of design. On the other hand, as the frequency is increased, lower-loss perturbations, such as air inclusions, may become a more attractive option.

Cubic Dielectric Resonator with Dielectric Cuts

Figure 16:
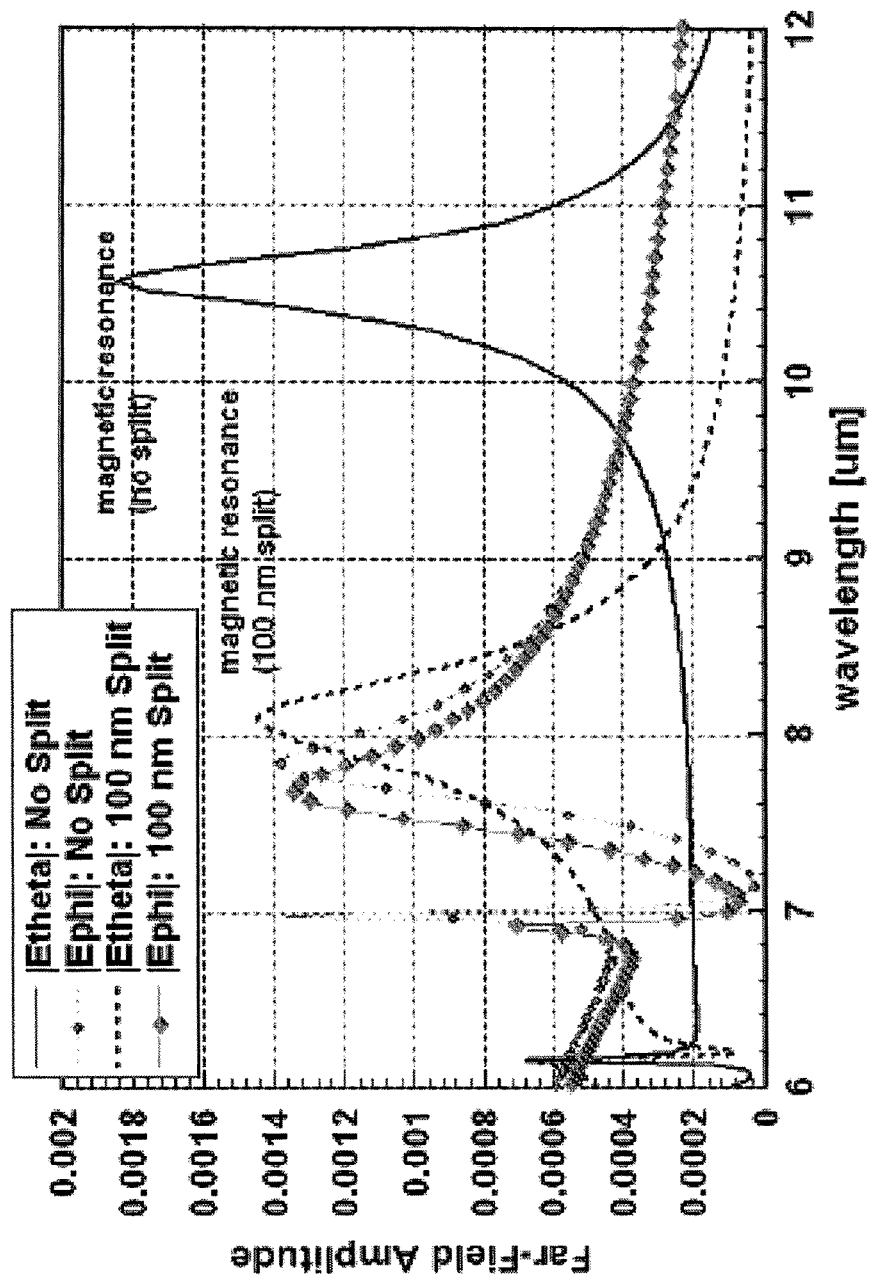
FIG. 16 is a graph of the comparison between the spectral positions of the electric and magnetic resonances for an unperturbed cubic resonator (in this case a PbTe cube with side length 1.53 μm) and the same cubic resonator with a 100 nm gap positioned as shown in FIG. 2(b). With a 100 nm gap, near-degeneracy between the lowest order electric and magnetic modes is realized.

For a cubic resonator (a=b=c) operating in the first magnetic mode with a cutout at the center x=0 (FIG. 2B), the normalized frequency shift according to the perturbation model becomes $$-\frac{\delta\omega}{\omega_0} = -\frac{\Delta}{4a}(\varepsilon_2/\varepsilon_p - 1)$$

where $\Delta$ is the split thickness and $\varepsilon_2/\varepsilon_p$ is the permittivity contrast. See L. K. Warne et al., "Perturbation Theory in the Design of Degenerate Rectangular Dielectric Resonators," *Progress in Electromagnetics Research B*, to be published. To obtain overlapping electric and magnetic modes, the desired shift according to perturbation theory is $\delta\omega/\omega_0 \approx 0.42$ (for comparison, the numerical simulation for the first magnetic mode indicates that $\delta\omega/\omega_0 \approx 0.36$ is required). Using the equation above, this shift is realized with an air split of normalized thickness $\Delta/a \approx 0.054$ for the case of a cubic resonator of side length 1.53 µm and permittivities $\varepsilon_2 = 32\varepsilon_0$ and $\varepsilon_p = \varepsilon_0$. For comparison, the simulation in FIG. 16 indicates that with a normalized cutout of $\Delta/a \approx 0.07$, the magnetic resonance is shifted from about 10.6 µm to approximately 8 µm. For this case of the air-split cube, the electric resonance is observed to shift slightly with the introduction of a split, but remains relatively fixed for all split dimensions thereafter.

It is important to note that for the rectangular resonator (as described above for the spherical resonator), the wavelength shift in the position of the magnetic resonance decreases as the thickness of the cutout is increased and eventually saturates to the magnetic resonance spectral position associated with the half-resonator structure.

Figure 17:
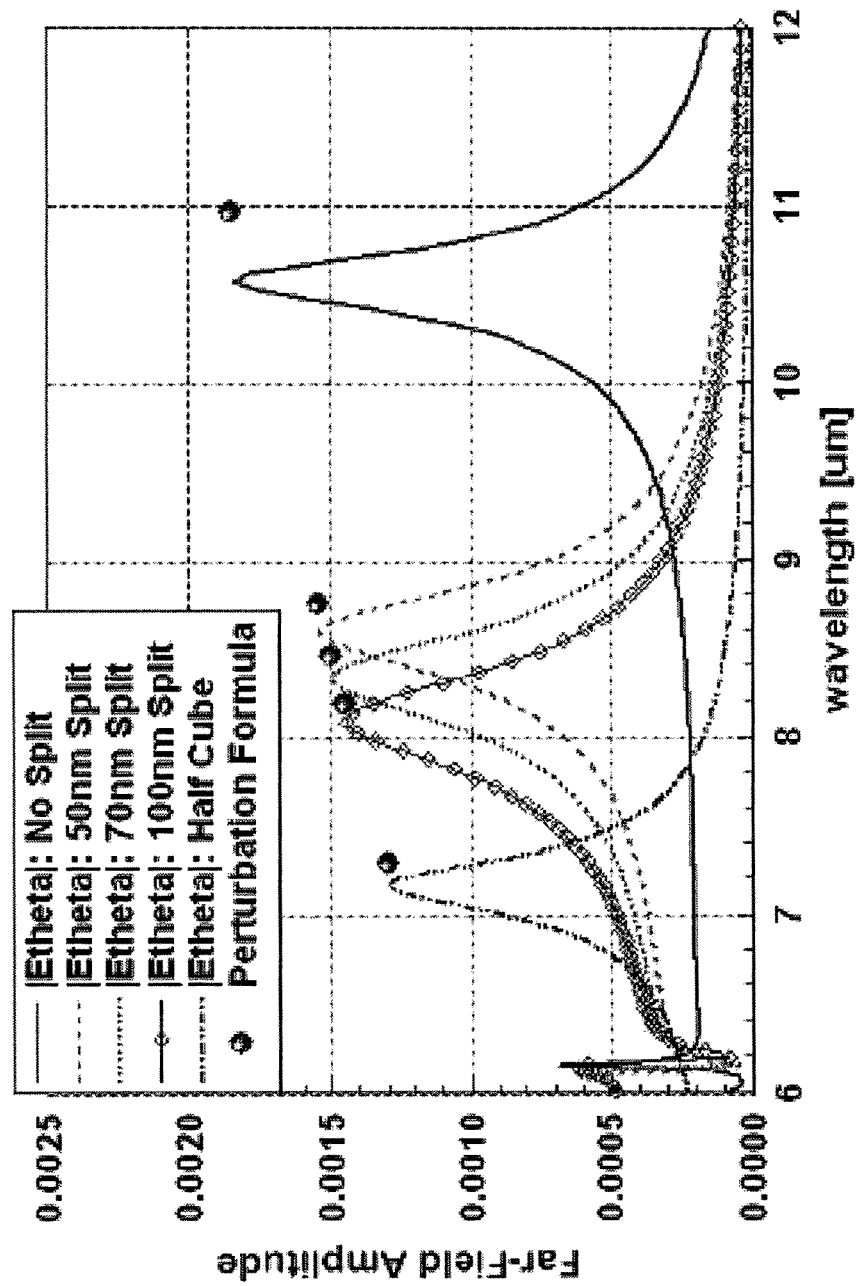
FIG. 17 is a graph that shows that as the split in the cube resonator (s=1:53 μm) is increased, the shift in the magnetic resonators saturates at the half-cube magnetic resonance limit. For comparison, the wavelength shifts predicted via the perturbation formula are shown for the cases of the unperturbed cubic resonator, a cube with a 50 nm, 70 nm, and 100 nm cutout, as well as a half cube resonator (note that the ordinate values associated with the points have been selected arbitrarily to place them in the vicinity of the resonant peaks of the simulations).

A saturation effect is observed with a normal electric field in the cutouts, as shown in FIG. 17, where the numerically-simulated shift in the magnetic resonance is seen to lessen with increasing split size according to $$\frac{\delta\omega}{\omega_0} \approx \frac{\Delta}{4a}(\varepsilon_2/\varepsilon_p - 1)/[1 + c_1(\varepsilon_2/\varepsilon_p - 1)(\Delta/a)]$$

where the same factor $\varepsilon_2/\varepsilon_p - 1$ is used in the denominator as the initial numerator factor and the coefficient $c_1 = 0.5$. A cube with dimension 2a=1.53 µm, $\varepsilon_2 = 32\varepsilon_0$, and $\varepsilon_1 = \varepsilon_0$ has resonant wavelength $\lambda_0 \sim 10.97$ µm. If this cube is split in half (b→b/2), each half has a predicted resonant wavelength of $\lambda_0 \sim 7.3$ µm. Hence a saturation value of $\delta\omega/\omega_0 \approx 0.50$ is expected.

Combining Perturbation Effects

Perturbations can be combined for the purposes of: 1) enabling operation further from the resonances and consequently enabling loss reductions, 2) overcoming the shift saturation discussed above and allowing smaller individual inclusions to be used, and in the final case, 3) making the resulting design somewhat invariant with respect to incident plane-wave angle.

Figure 18:
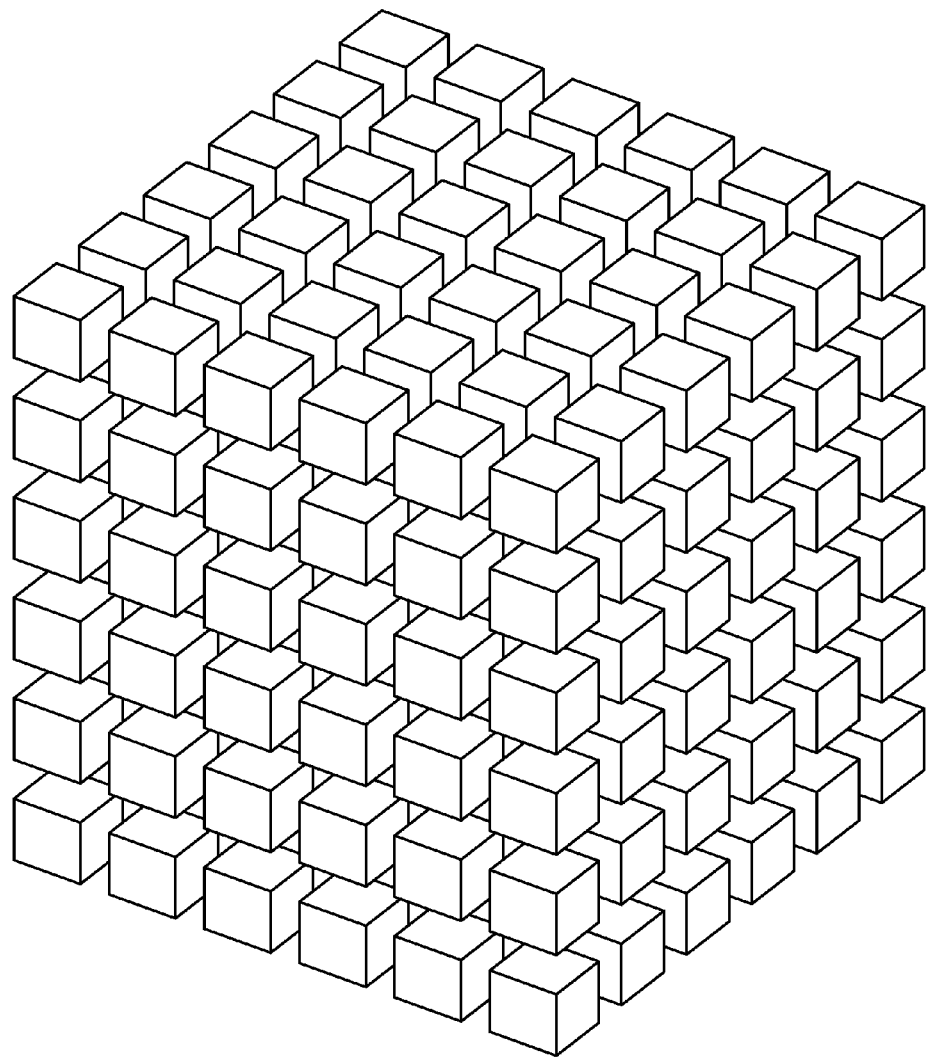
FIG. 18 is a schematic illustration of a periodic array of dielectric cubic resonators.

In order to allow flexibility in precise alignment of the modal resonances, as well as to operate further away from the large losses associated with the resonant peak region, the responses in a lattice of perturbed resonators (including either dipole inclusions or air splits, for example) can be boosted by using a larger volume-packing fraction. An example of a periodic-array of cubic dielectric resonators is shown in FIG. 18. With the extra degree of freedom associated with the lattice arrangement (versus the single-resonator response), it is possible, for example, to achieve negative index in the tail regions of the two resonances where the losses are lower. Increases in the packing fraction have also been shown to decrease the loss associated with a metal-core, dielectric-shell spherical design. See Basilio (2011).

Cubic Dielectric Resonator with Air Split and Metallic Decorations

Figure 19:
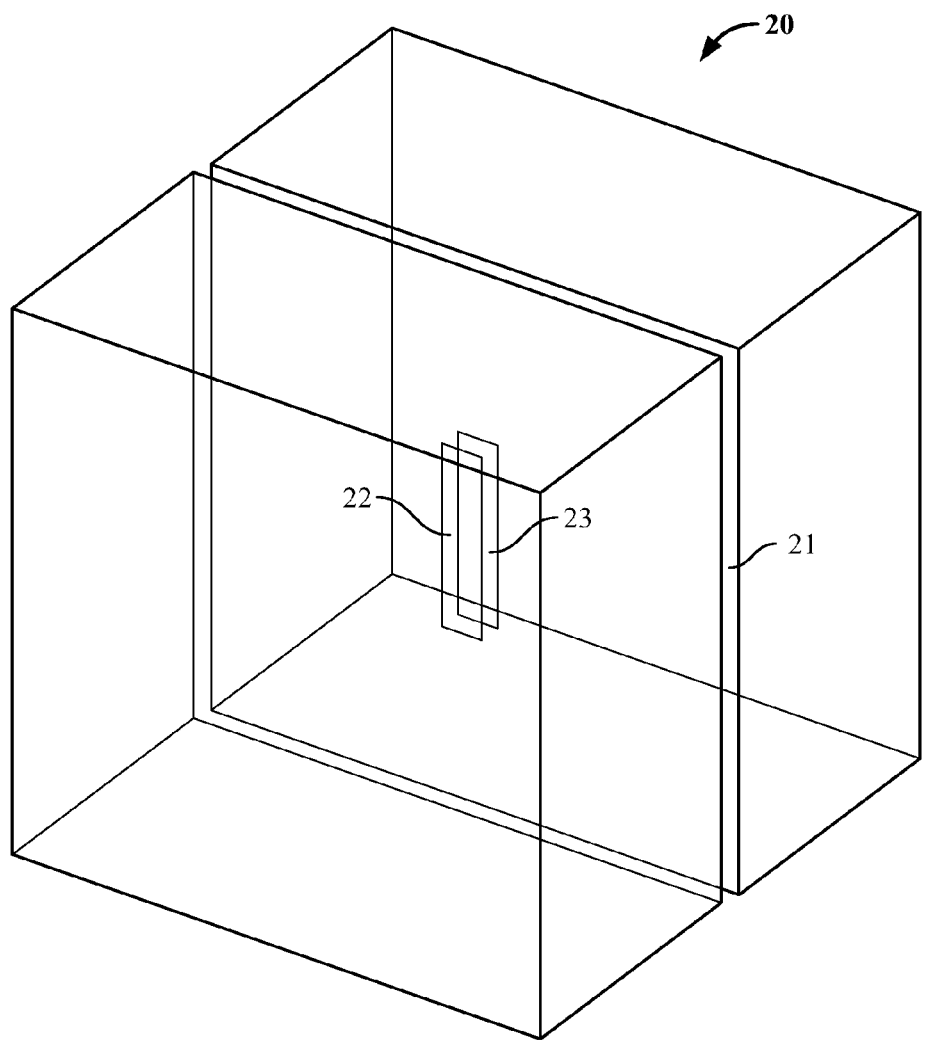
FIG. 19 is a schematic illustration of a dual-perturbation cubic resonator design that uses an air split together with metallic-strip dipoles (on each face of the split) to realize modal degeneracy.

If minimizing the size of the perturbations is of interest (in accordance with fabrication issues or loss considerations, for example), perturbations can be combined so as to simultaneously frequency shift the magnetic and electric resonances toward each other and ultimately realize overlap at some intermediate frequency to the fundamental ones. In the rectangular resonator approaches discussed above, one inclusion type was employed to selectively frequency shift one resonance while leaving the other unperturbed. FIG. 19 shows a rectangular resonator 20 that includes an air split 21 used to interact with the lowest-order magnetic resonance plus two strip dipoles 22 and 23 placed on each face of the split for interaction with the lowest-order electric resonance. Here modal degeneracy is obtained by orienting the air split perpendicular to the direction of propagation (and parallel to the plane containing the incident plane-wave polarizations H and E), orienting the strip dipoles along the direction of the incident electric field E, and choosing the appropriate split-thickness and dimensions of the dipole to realize the desired frequency shifts.

Advantages of the dual-perturbation design, such as that shown in FIG. 19, are that the electrical size of the resonator is kept smaller versus the single air-split design (since alignment of the resonances occurs at an intermediate frequency rather than at the higher frequency of the fundamental electric resonance characterizing the unperturbed rectangular resonator) and that the saturation effect discussed above is circumvented with multiple perturbations. It is important to recognize however that for higher-frequency operation where losses associated with the metallic dipoles may not be tolerable, the multiple-perturbation designs discussed below may be preferable.

Figure 20:
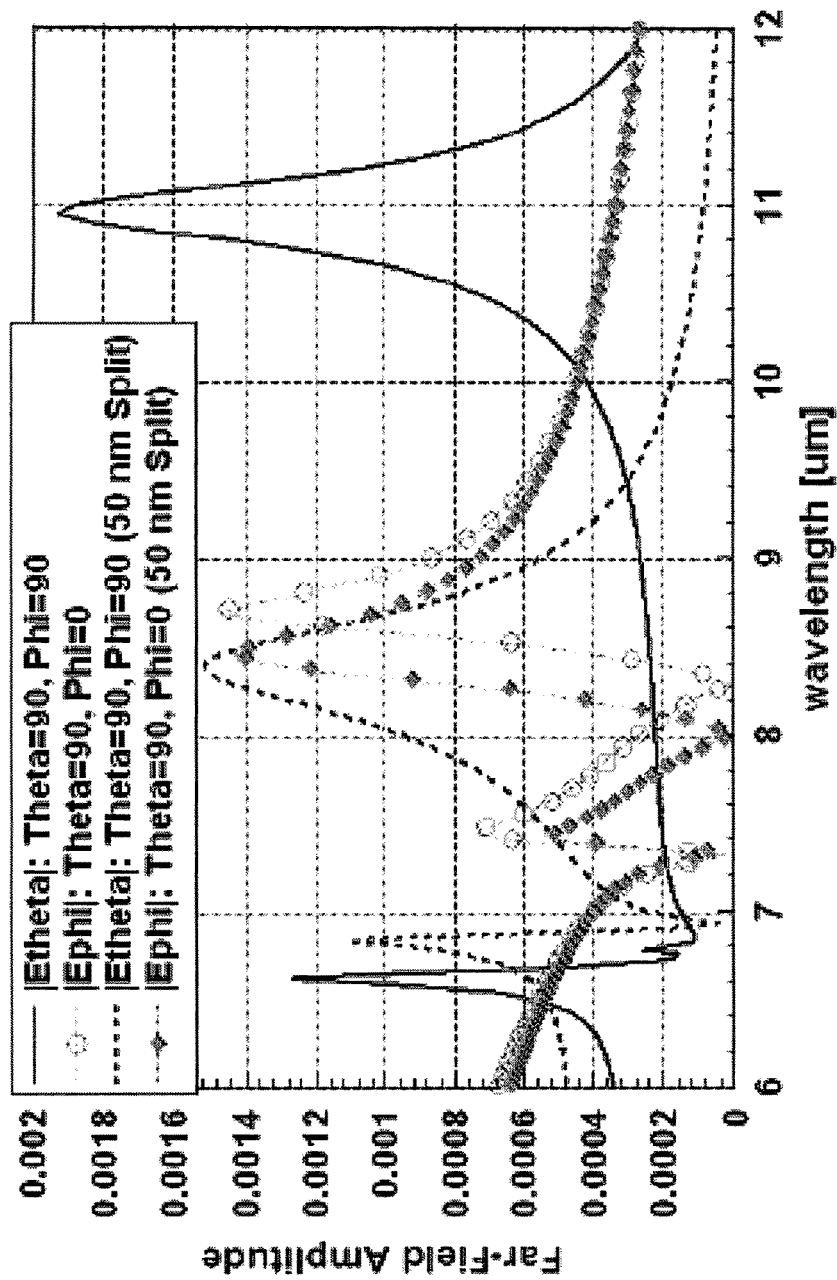
FIG. 20 is a graph that shows that as a cubic PbTe resonator is stretched along the direction of the incident magnetic field to realize a wavelength upshift in the electric resonance and a cut is introduced along the direction of propagation to yield a wavelength downshift in the magnetic resonance.

Rectangular Dielectric Resonator with Air Split and Variable Rectangular Aspect Ratio As an alternative to the cubic-resonator designs that have been discussed thus far, the aspect ratio of the resonators can also be manipulated (going from cubic to rectangular) to help bring about modal degeneracy. More specifically, a slight elongation in the incident magnetic field direction results in a wavelength upshift of the electric resonance but yields less of an upshift (in wavelength) of the magnetic resonance (since the magnetic field already penetrates the exterior region in this direction). This approach can thus be used to progress toward resonance alignment (since the magnetic resonance already existed at a longer wavelength than the electric resonance). Combining this perturbation effect with that accompanying an air-split inclusion (which can be used to further downshift the magnetic resonance in wavelength) provides a path towards an alternative degenerate resonator design. FIG. 20 shows the simulation results for a slightly elongated PbTe resonator (the side lengths of the resonator in the y and z-directions are 1.53 μm, while the length along the x-direction of the incident H field is 1.91 μm) and containing a single air split of 50 nm. Thus, with the elongation of the cube together with a relatively minor cut perturbation, modal degeneracy is observed (for this design degeneracy occurs at λ~8.3 μm). The electric resonance position has been shifted upward in wavelength from its original position of 7.8 μm (FIG. 12) to 8.7 μm due to the stretching of the cube in the x-direction but moves down slightly in wavelength with the introduction of the air split. For comparison, in using a cubic resonator geometry (1.53 μm for all sides), an air split of over 150 nm is necessary to achieve modal alignment (however, by this point saturation in the shifting of the magnetic resonance becomes a significant factor). It is also important to point out that although further increasing the aspect ratio of the cube (this example used an aspect ratio of 1.25) does lead to greater shifts in the electric resonance, the goal with these designs is to keep the size of the resonators down with the combination of the elongation and the split perturbation so as to remain in the effective-media limit.

Rectangular Dielectric Resonator with Multiple Cuts (Dielectric Anisotropy)

Figure 21B:
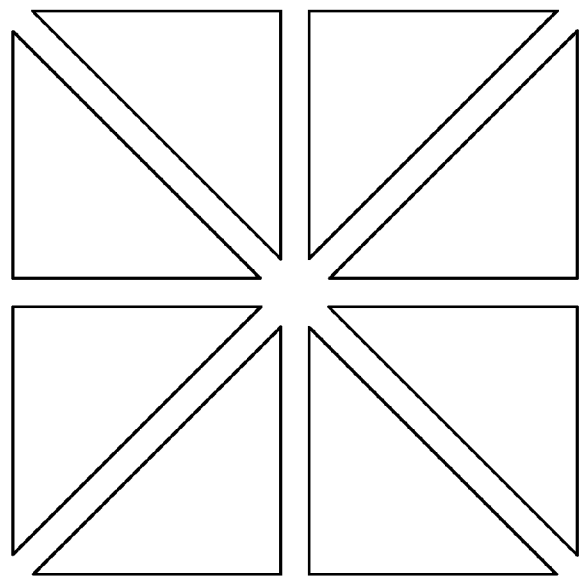
FIG. 21B is a schematic illustration of diagonal cuts in a resonator that has a square cross section.
Figure 21A:
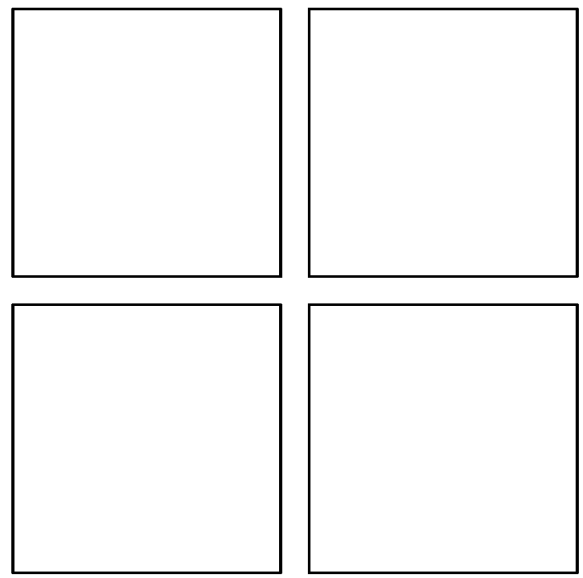
FIG. 21A is a schematic illustration of air-split perturbations introduced in the cross section of a rectangular dielectric resonator to realize more flexibility in the tuning range of the magnetic resonance.
Figure 22:
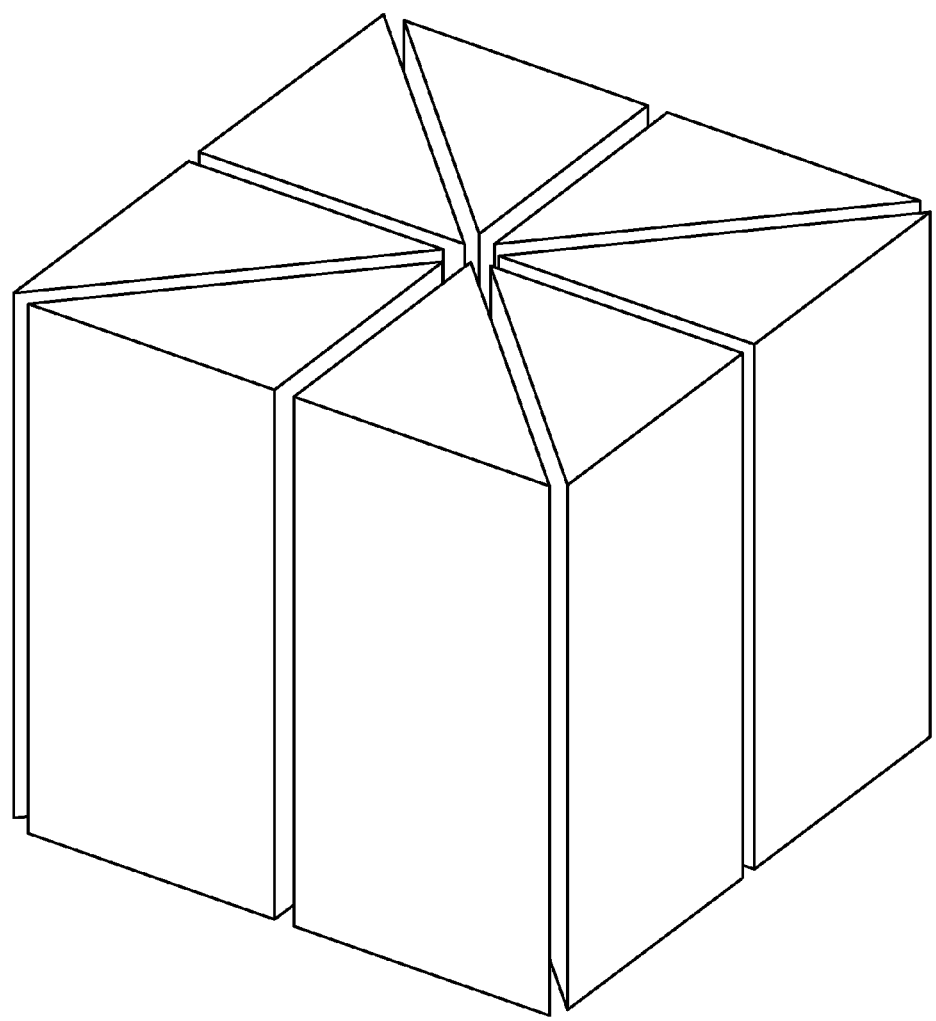
FIG. 22 is a three-dimensional schematic illustration of the four-cut cube geometry shown in FIG. 21B.

The modal-shifting limitations discussed above can be overcome by introducing multiple air splits in the dielectric resonator. In a similar manner to the multiple air-split spherical designs discussed above, rectangular resonators split in the cross section perpendicular to the incident electric field can be used to realize a greater tuning range (beyond the saturation limit inherent to the single air-split approach). A multiple air-split rectangular design with cuts in the cross section denoted by the local x-y plane with the incident electric field oriented along the local z direction (that is, cuts in the local x-z and y-z planes) is shown in FIG. 21A. It is important to recognize that an additional advantage of this approach, besides overcoming saturation limitations, is that the resonator response becomes more independent of the azimuthal angle of incidence (for a spherical resonator with many cuts, the response becomes independent of azimuthal angle of incidence).

In the specialized case of a rectangular resonator with a square cross section perpendicular to the incident electric field direction, the symmetries can be further used to cut the dielectric along the diagonals since there is no normal electric field with respect to these additional cuts for the first electric mode. Such split-rectangular resonators are shown in FIGS. 20, 21A and 21B.

Figure 23:
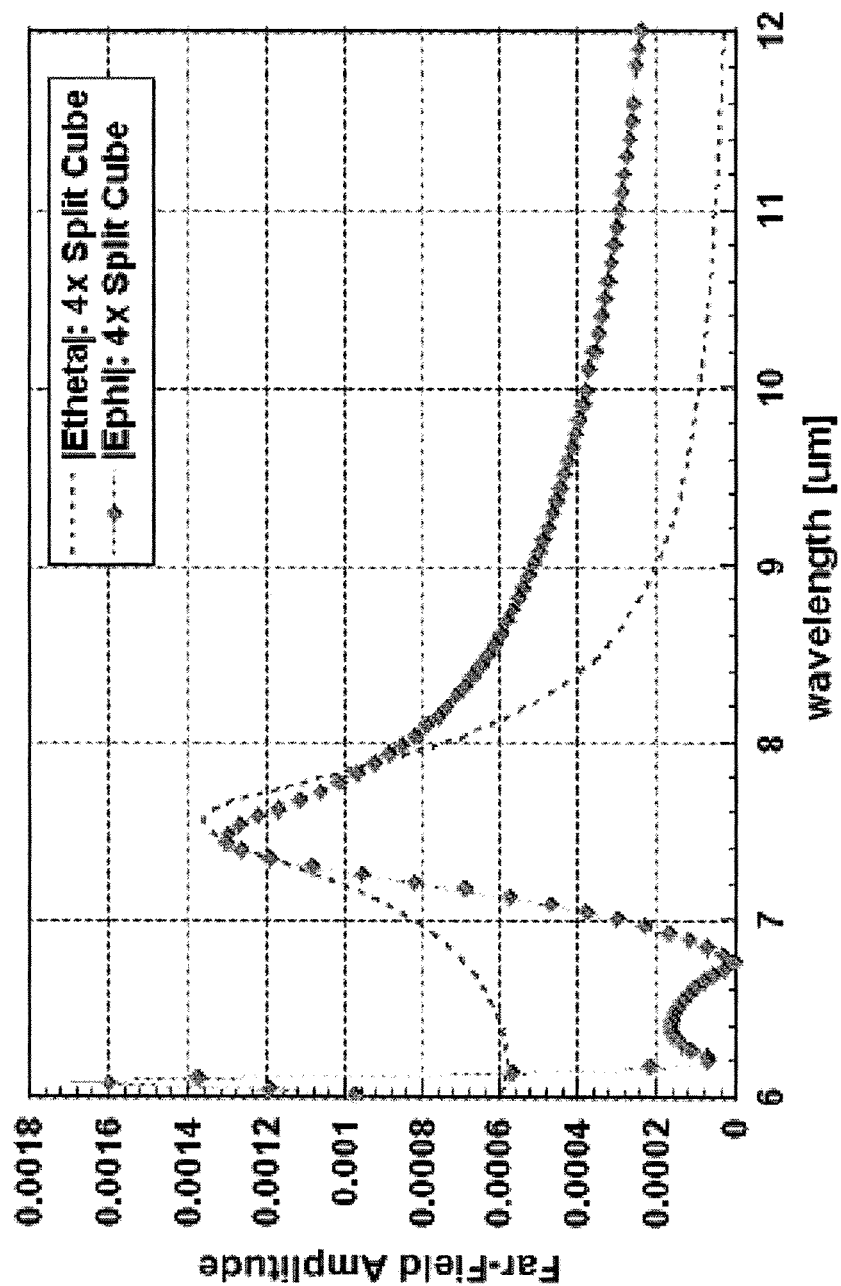
FIG. 23 is a graph that shows that the introduction of four air splits (of 50 nm each) in a cubic PbTe resonator of side length 1.53 μm, modal degeneracy of the two lowest-order modes is realized and the second magnetic mode is pushed away from the degenerate frequency.
Figure 24:
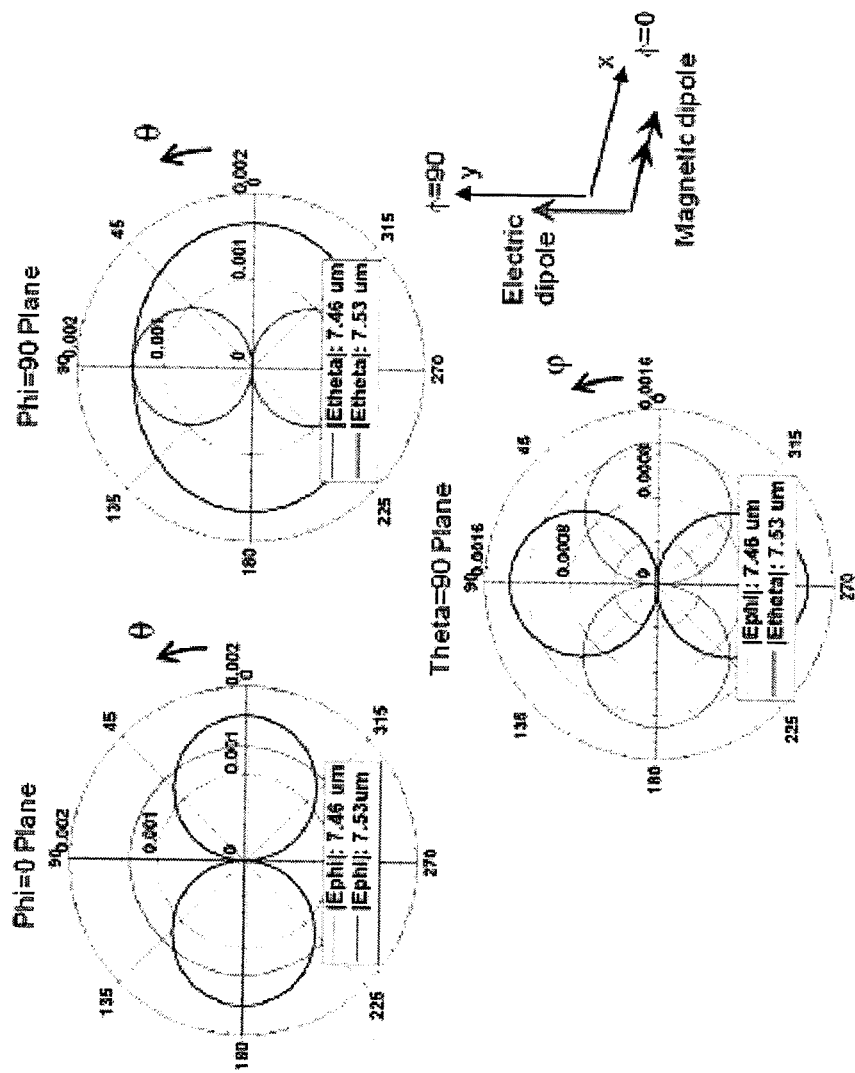
FIG. 24 is a graph of the scattered patterns associated with a four-cut cubic PbTe resonator (side length 1.53 μm) with 50 nm gaps. The patterns are sampled at each of the peak frequencies determined from the results in FIG. 23.

Four-split rectangular resonator designs also have the advantage that the second magnetic mode will be further displaced from the degenerate frequency of the two lowest-order modes; note that in the unperturbed resonator and single-split designs this mode is located at approximately 7.0 μm. Suppressing this higher-order mode near the operating frequency means that additional losses are not incurred. In FIG. 23 alignment between the magnetic and electric modes is seen to occur at approximately 7.5 μm for the four-split rectangular design including 50 nm splits. To verify the dipole nature of the modes, the scattered patterns at the two-lowest order resonances of the four-split cube are presented in FIG. 24.

The present invention has been described as a single-resonator unit cell that can be used in a periodic assembly to form a double-negative metamaterial. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A double-negative metamaterial, comprising a periodic array of single-resonator unit cells, each resonator comprising at least one inclusion in a dielectric structure wherein the at least one inclusion has a different permittivity than the dielectric structure material and wherein the at least one inclusion comprises at least one high-permittivity inclusion, thereby shifting the higher frequency, lowest-order electric resonance of the resonator to a lower frequency, and at least one low-permittivity inclusion, thereby shifting the lower frequency, lowest-order magnetic resonance of the resonator to a higher frequency such that the electric resonance and the magnetic resonance of the resonator are in alignment at an operating frequency, thereby providing a metamaterial having a negative index of refraction.

2. The double-negative metamaterial of claim 1, wherein the at least one high-permittivity inclusion has an elongated shape.

3. The double-negative metamaterial of claim 2, wherein the elongated shape comprises a rod or prolate spheroid.

4. The double-negative metamaterial of claim 1, wherein the at least one high-permittivity inclusion comprises a metallic dipole.

5. The double-negative metamaterial of claim 1, wherein the at least one low-permittivity inclusion has a thin, pancake-like shape.

6. The double-negative metamaterial of claim 1, wherein the low-permittivity inclusion comprises a cut plane or oblate spheroid.

7. The double-negative metamaterial of claim 1, wherein the at least one low-permittivity inclusion comprises an air split, gas-filled gap, vacuum gap, or a dielectric foam.

8. The double-negative metamaterial of claim 1, wherein the at least one low-permittivity inclusion comprises two or more cut planes placed rotationally about an incident electric field axis and at symmetry angles of each resonator.

9. The double-negative metamaterial of claim 1, wherein the dielectric structure comprises a spherical or rectangular structure.

10. The double-negative metamaterial of claim 1, wherein the dielectric structure comprises $Zr_xSn_{1-x}TiO_4$.

11. The double-negative metamaterial of claim 1, wherein the dielectric structure comprises PbTe or Te.

* * * * *